US007217500B2

(12) United States Patent
Kunita et al.

(10) Patent No.: US 7,217,500 B2
(45) Date of Patent: May 15, 2007

(54) COLOR IMAGE-FORMING MATERIAL AND LITHOGRAPHIC PRINTING PLATE PRECURSOR

(75) Inventors: Kazuto Kunita, Shizuoka (JP); Yasuhito Oshima, Shizuoka (JP); Hidekazu Oohashi, Shizuoka (JP)

(73) Assignee: Fujifilm Corporation, Kanagawa (JP)

( * ) Notice: Subject to any disclaimer, the term of this patent is extended or adjusted under 35 U.S.C. 154(b) by 0 days.

(21) Appl. No.: 11/209,696

(22) Filed: Aug. 24, 2005

(65) Prior Publication Data

US 2006/0046189 A1 Mar. 2, 2006

(30) Foreign Application Priority Data

Aug. 26, 2004 (JP) .......................... P.2004-246908

(51) Int. Cl.
*G03F 7/038* (2006.01)
*G03F 7/028* (2006.01)
*G03F 7/14* (2006.01)

(52) U.S. Cl. .................. 430/281.1; 430/292; 430/302; 430/334; 430/339; 430/964

(58) Field of Classification Search ................ 430/292, 430/334, 339, 964, 281.1, 302
See application file for complete search history.

(56) References Cited

U.S. PATENT DOCUMENTS 6,110,646 A * 8/2000 Urano et al. ................ 430/302
6,399,279 B1 * 6/2002 Urano et al. ................ 430/302
6,596,457 B1 * 7/2003 Hidaka et al. ........... 430/270.1

FOREIGN PATENT DOCUMENTS

| | | | |
|---|---|---|---|
| JP | 2938397 | A | 6/1999 |
| JP | 11-277927 | A | 10/1999 |
| JP | 2001-277740 | A | 10/2001 |
| JP | 2002-287334 | A | 10/2002 |

* cited by examiner

*Primary Examiner*—Richard L. Schilling
(74) *Attorney, Agent, or Firm*—Birch, Stewart, Kolasch & Birch, LLP

(57) ABSTRACT

A color image-forming material capable of drawing an image by infrared laser exposure and excellent in image visibility, storage stability and white light stability, and an on-press development or non-processing (non-development) type lithographic printing plate precursor ensuring high sensitivity and high press life and being excellent in image visibility, on-press developability and the like, are provided, which are a color image-forming material comprising an image recording layer capable of drawing an image by infrared laser exposure, the color image-forming material forming a color image without passing through a development processing step after image recording, wherein the image recording layer comprises (A) an infrared absorbent, (B) a cyclic color-forming compound having a cyclic structure within the molecule and forming a dye by a ring opening, and (C) a dye stabilizer which is a compound interacting with the cyclic color-forming compound to stabilize the ring-opened dye body and cause color formation and which is released from the interaction upon laser exposure to decrease in the color formation; and a lithographic printing plate precursor using this color image-forming material.

7 Claims, No Drawings

COLOR IMAGE-FORMING MATERIAL AND LITHOGRAPHIC PRINTING PLATE PRECURSOR

BACKGROUND OF THE INVENTION

1. Field of the Invention

The present invention relates to a color image-forming material and a lithographic printing plate precursor. More specifically, the present invention relates to a color image-forming material and a lithographic printing plate precursor, from which plate-making can be directly made by scanning an infrared laser based on digital signals of a computer or the like and which are usable for printing without passing through a development processing step after exposure.

2. Background Art

The lithographic printing plate in general consists of a lipophilic image area of receiving an ink in the printing process and a hydrophilic non-image area of receiving a fountain solution The lithographic printing is a printing method utilizing the repulsion between water and oily ink from each other, where the lipophilic image area of the lithographic printing plate and the hydrophilic non-image area are formed as an ink-receiving part and a fountain solution-receiving part (ink non-receiving part), respectively, to cause difference in the ink adhesion on the surface of the lithographic printing plate, an ink is attached only to the image area and thereafter, the ink is transferred to a material on which the image is printed, such as paper, thereby performing printing.

For producing this lithographic printing plate, a lithographic printing plate precursor (PS plate) comprising a hydrophilic support having provided thereon a lipophilic photosensitive resin layer (image recording layer) has been heretofore widely used. Usually, a lithographic printing plate is obtained by a plate-making method where the lithographic printing plate precursor is exposed through an original image such as lith film and while leaving the image recording layer in the image area, the image recording layer in the non-image area is dissolved and removed with an alkaline developer or an organic solvent to reveal the hydrophilic support surface.

In the plate-making process using a conventional lithographic printing plate precursor, a step of dissolving and removing the non-image area with a developer or the like according to the image recording layer must be provided after exposure but as one of the problems to be solve, it is demanded to dispense with or simplify such an additional wet processing. Particularly, the treatment of waste solution discharged accompanying the wet processing is recently a great concern to the entire industry in view of consideration for global environment, and the demand for solving the above-described problem is becoming stronger.

As for the non-processing (non-development) type dispensable with the wet processing, a lithographic printing plate precursor having an image recording layer of which affinity for fountain solution or ink changes on the surface upon exposure, and being capable of printing without removing the image recording layer has been proposed.

Also, as one simple and easy plate-making method, a method called on-press development has been proposed, where an image recording layer allowing for removal of the non-image area of a lithographic printing plate precursor during a normal printing process is used and after exposure, the non-image area is removed on a printing press to obtain a lithographic printing plate.

Specifically, the on-press development method includes, for example, a method using a lithographic printing plate precursor having an image recording layer dissolvable or dispersible in a fountain solution, an ink solvent or an emulsified product of fountain solution and ink, a method of mechanically removing the image recording layer by the contact with rollers or a blanket cylinder of a printing press, and a method of weakening the cohesion of the image recording layer or adhesion between the image recording layer and the support by the impregnation of a fountain solution, an ink solvent or the like and then mechanically removing the image recording layer by the contact with rollers or a blanket cylinder.

In the present invention, unless otherwise indicated, the "development processing step" indicates a step where, by using an apparatus (usually an automatic developing machine) except for a printing press, the infrared laser unexposed portion of the lithographic printing plate precursor is removed through contact with a liquid (usually an alkaline developer) to reveal the hydrophilic support surface, and the "on-press development" indicates a method or step where, by using a printing press, the infrared laser unexposed portion of the lithographic printing plate precursor is removed through contact with a liquid (usually a printing ink and/or a fountain solution) to reveal the hydrophilic support surface.

However, when an image recording layer in a conventional image recording system utilizing ultraviolet ray or visible light is used, the image recording layer is not fixed even after exposure and therefore, the lithographic printing plate precursor after exposure must be stored in a completely light-shielded state or constant-temperature condition until loading it on a printing press but this is cumbersome and takes time.

On the other hand, a digitization technique of electronically processing, storing and outputting image information by using a computer has been recently widespread and various new image-output systems coping with such a digitization technique have been put into practical use. Along with this, a computer-to-plate technique is attracting attention, where digitized image information is carried on a highly converging radiant ray such as laser light, and a lithographic printing plate precursor is scan-exposed by this light to directly produce a lithographic printing plate with no intervention of a lith film. Accordingly, one of important technical problems to be solved is to obtain a lithographic printing plate precursor suitable for such a technique.

In this way, the demand for simplification, dry processing or non-processing of the plate-making work is recently ever-stronger in view of both consideration for global environment and adaptation to digitization.

Recently, high output lasers such as semiconductor laser of emitting an infrared ray at a wavelength of 760 to 1,200 nm and YAG laser are inexpensively available, and a method using such a high output laser as the image recording means is a promising method for producing a lithographic printing plate by scan-exposure which is easy to integrate into the digitization technique.

In conventional plate-making methods, a photosensitive lithographic printing plate precursor is imagewise exposed with light at low to medium intensity, as a result, a photochemical reaction occurs in the image recording layer to cause imagewise physical change, whereby an image is recorded.

On the other hand, in the method using the high output laser, a large quantity of light energy is irradiated on the exposure region in a very short time to efficiently convert the light energy into heat energy, as a result, by the effect of heat generated, thermal change such as chemical change, phase change and change in morphology or structure is caused and such change is used for the image recording. Accordingly, although the image information is input by the effect of light energy of laser light or the like, the image recording is performed in the state that not only the light energy but also a reaction by the heat energy are utilized. The recording system using the heat generation by such high power density exposure is usually called "heat-mode recording", and the conversion of from light energy to heat energy is called "light-to-heat conversion". In the present invention, such an image recording layer is also called an image recording layer.

The plate-making method using the heat-mode recording is greatly advantageous in that the image recording layer is not photosensitized with light of normal intensity level, such as room lighting, and fixing of the image recorded by high intensity exposure is not essential. In other words, the lithographic printing plate precursor used for heat-mode recording is free from fear that the image recording layer is photosensitized with room light before exposure, and fixing of the image after exposure is not essential. Therefore, for example, when an image recording layer which is insolubilized or solubilized upon exposure by a high output laser is used and the plate-making process of imagewise processing the exposed image recording layer to produce a lithographic printing plate is performed by on-press development, a printing system where even if the image recording layer after exposure is exposed to ambient light in a room, the image is not affected can be established. Accordingly, it is expected that when the heat-mode recording is utilized, a lithographic printing plate precursor suitably used for on-press development can be obtained.

With respect to this technique, for example, Patent Document 1 (Japanese Patent No. 2,938,397) describes a lithographic printing plate precursor comprising a hydrophilic support having provided thereon an image-forming layer obtained by dispersing hydrophobic thermoplastic polymer particles in a hydrophilic binder. In Patent Document 1, it is stated that the lithographic printing plate precursor can be exposed to an infrared laser to cause coalescent of hydrophobic thermoplastic polymer particles by the effect of heat and thereby form an image, loaded on a cylinder of a printing press, and then on-press developed with a fountain solution and/or an ink.

However, the method of forming an image by the coalescence through mere heat fusion of fine particles is found to have a problem that the image strength is weak and the press life is insufficient, despite good on-press developability.

To solve this problem, it is proposed to improve the press life by utilizing a polymerization reaction. For example, Patent Document 2 (JP-A-2001-277740 (the term "JP-A" as used herein means an "unexamined published Japanese patent application")) describes a lithographic printing plate precursor comprising a hydrophilic support having thereon an image recording layer (heat-sensitive layer) containing polymerizable compound-enclosing microcapsules. Furthermore, Patent Document 3 (JP-A-2002-287334) describes a lithographic printing plate precursor comprising a support having provided thereon an image recording layer (photosensitive layer) containing an infrared absorbent, a radial polymerization initiator and a polymerizable compound.

On the other hand, as for the non-processing type lithographic printing plate precursor, a technique of enhancing the visibility between the exposed area and the unexposed area is demanded and, for example, Patent Document 4 (JP-A-11-277927) describes a non-processing type lithographic printing plate precursor capable of color image recording by the color formation due to acid, base or radical upon infrared laser exposure. However, in the light of restriction from the work environment where the non-processing type lithographic printing plate precursor is used, it is not sufficient that the exposed area merely causes color change with respect to the unexposed area. The technical problem to be solved is to satisfy at least the following conditions: (a) the color change gives lightness difference $\Delta L \geqq 4$, (b) the color change does not occur under white light such as fluorescent light (good white light stability), (c) the color change does not occur during storage of an unexposed plate (good storage stability), and (d) particularly, in application to an on-press development type lithographic printing plate precursor, the color is changed to be colorless or thin-colored at the on-press development and even if only a part is mingled into the printed matter, this causes no evil effect, for example, color change. A technique for color image formation satisfying these various conditions is being demanded.

SUMMARY OF THE INVENTION

An object of the present invention is to provide a color image-forming material excellent in image visibility, storage stability and white light stability. Another object of the present invention is to provide an on-press development or non-processing (non-development) type lithographic printing plate precursor ensuring high sensitivity and high press life and being excellent in image visibility, on-press developability, storage stability and white light stability. Still another object of the present invention is to provide a lithographic printing method comprising on-press development of such a lithographic printing pate precursor.

As a result of intensive investigations, the present inventors have found that the above-described objects can be attained by using an image recording layer comprising (A) an infrared absorbent, (B) a specific cyclic color-forming compound and (C) a specific dye stabilizer of causing color formation of the cyclic color-forming compound. The present invention has been accomplished based on this finding.

That is, the present invention is as follows.

(1) A color image-forming material comprising an image recording layer capable of drawing an image by infrared laser exposure, the color image-forming material forming a color image without passing through a development processing step after image recording, wherein the image recording layer comprises (A) an infrared absorbent, (B) a cyclic color-forming compound having a cyclic structure within the molecule and forming a dye by a ring opening, and (C) a dye stabilizer which is a compound interacting with the cyclic color-forming compound to stabilize the ring-opened dye body and cause color formation and which is released from the interaction upon laser exposure to decrease in the color formation.

(2) A lithographic printing plate precursor comprising a support and an image recording layer capable of drawing an image by infrared laser exposure, the lithographic printing plate precursor being capable of printing by loading it on a printing press without passing through a development process step after image recording or by recording an image after loading it on a printing press, wherein the image recording layer comprises (A) an infrared absorbent, (B) a cyclic color-forming compound having a cyclic structure within the molecule and forming a dye by a ring opening, and (C) a dye stabilizer which is a compound interacting with the cyclic color-forming compound to stabilize the ring-opened dye body and cause color formation and which is released from the interaction upon laser exposure to decrease in the color formation.

(3) The lithographic printing plate precursor as described in (2), wherein the image recording layer comprises a radical polymerization initiator and a polymerizable compound.

(4) The lithographic printing plate precursor as described in (2) or (3), wherein the image recording layer is an image recording layer removable by a printing ink and/or a fountain solution.

(5) The color image-forming material or lithographic printing plate precursor as described in any one of (1) to (4), wherein the cyclic color-forming compound (B) is selected from the group consisting of the compounds represented by the following formulae (I) to (IV):

(I)

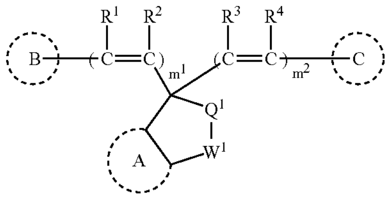

wherein the rings A, B and C each independently represents a mono-, di- or tri-nuclear aromatic hydrocarbon group which may have a substituent, or a mono-, di- or tri-nuclear aromatic heterocyclic group which may have a substituent, $W^1$ represents a carbonyl group, a thiocarbonyl group or a group —$C(R^{25})$═N—, $R^{25}$ represents a hydrogen atom or a hydrocarbon group which may have a substituent, $Q^1$ represent an oxygen atom, a sulfur atom or an imino group which may have a substituent, $R^1$ to $R^4$ each independently represents a hydrogen atom or a hydrocarbon group which may have a substituent, $m^1$ represents 0 or 1, $m^2$ represents 0 or 1, and the rings B and C may combine with each other through a binding group, with the proviso that at least one of the ring B and the ring C has at least one substituent selected from the group consisting of an amino group which may have a substituent, an alkoxy group which may have a substituent, an aryloxy group which may have a substituent, an alkylthio group which may have a substituent, and an arylthio group which may have a substituent;

(II)

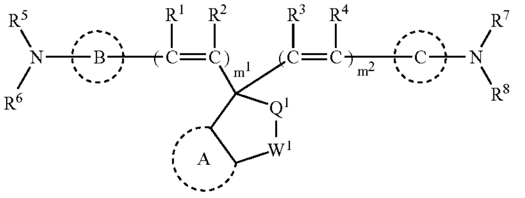

wherein the rings A, B and C each independently represents a mono-, di- or tri-nuclear aromatic hydrocarbon group which may have a substituent, or a mono-, di- or tri-nuclear aromatic heterocyclic group which may have a substituent, $W^1$ represents a carbonyl group, a thiocarbonyl group or a group —$C(R^{25})$═N—, $R^{25}$ represents a hydrogen atom or a hydrocarbon group which may have a substituent, $Q^1$ represent an oxygen atom, a sulfur atom or an imino group which may have a substituent, $R^1$ to $R^4$ each independently represents a hydrogen atom or a hydrocarbon group which may have a substituent, $m^1$ represents 0 or 1, $m^2$ represents 0 or 1, $R^5$ to $R^8$ each independently represents a hydrogen atom, a hydrocarbon group which may have a substituent, or an acyl group which may have a substituent, the rings B and C may combine with each other through a binding group, $R^5$ or $R^6$ and the ring B may combine with each other through a binding group, and $R^7$ or $R^8$ and the ring C may combine with each other through a binding group;

(III)

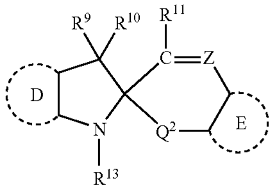

wherein the rings D and E each independently represents a mono-, di- or tri-nuclear aromatic hydrocarbon group which may have a substituent, or a mono-, di- or tri-nuclear aromatic heterocyclic group which may have a substituent, $Q^2$ represent an oxygen atom or a sulfur atom, $R^9$ to $R^{11}$ each independently represents a hydrogen atom, a halogen atom or a hydrocarbon group which may have a substituent, $R^{13}$ represents a hydrogen atom or a hydrocarbon group which may have a substituent, Z represents C—$R^{12}$ or N, and $R^{12}$ represents a hydrogen atom, a halogen atom or a hydrocarbon group which may have a substituent; and (IV)

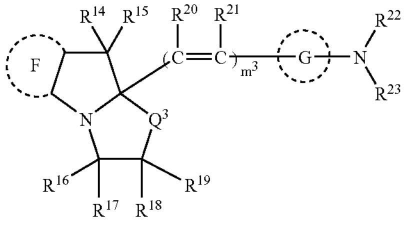

(wherein the rings F and G each independently represents a mono-, di- or tri-nuclear aromatic hydrocarbon group which may have a substituent, or a mono-, di- or tri-nuclear aromatic heterocyclic group which may have a substituent, $R^{14}$ to $R^{21}$ each independently represents a hydrogen atom or a hydrocarbon group which may have a substituent, $R^{22}$ and $R^{23}$ each independently represents a hydrogen atom, a hydrocarbon group which may have a substituent, or an acyl group which may have a substituent, $Q^3$ represent an oxygen atom or a sulfur atom, and $m^3$ represents 1 or 2.

(6) The color image-forming material or lithographic printing plate precursor as described in any one of (1) to (5), wherein the dye stabilizer (C) is at least one of a compound having an acid group and an ionic compound.

(7) A lithographic printing method comprising: image-exposing the lithographic printing plate precursor described in any one of (2) to (6) by using an infrared laser; performing a plate-making by removing the unexposed area of the image recording layer of the image-exposed lithographic printing plate precursor on a printing press; and performing printing by using the produced lithographic printing plate.

The mechanism of the present invention is not clearly known but considered as follows. A dye (color forming element) in a metastable state created by the interaction of (B) a specific cyclic color-forming compound (hereinafter sometimes simply referred to as "(B)") with (C) a specific dye stabilizer (hereinafter sometimes simply referred to as "(C)") is released from the interaction or changed in the interacted state due to heat generated from an infrared absorbent as a light-to-heat conversion material upon laser exposure and this causes change in the structure of the color forming element and in turn in the color hue, whereby the color image formation is effected. In this way, a reaction does not occur under light such as fluorescent light and therefore, the image recording layer is stable. Also, the interaction between the cyclic color-forming compound and the dye stabilizer takes place in a high-temperature region and no change arises at a temperature such as storage condition (at highest, 45° C. or less), so that good storage stability can also be obtained. Furthermore, in application to an on-press development type lithographic printing plate, a color forming element is not produced because the interaction of (B) and (C) is released at the on-press development (the image recording layer is dissolved or dispersed in a fountain solution or an ink, as a result, the interaction between two molecules is released), and the image recording layer is rendered colorless or thin-colored and thereby is imparted with satisfactory performance.

Accordingly, the image recording layer of the present invention is suitably used for a non-processing type lithographic printing plate precursor, particularly, an on-press development type lithographic printing plate precursor, which is compatible to a heat mode laser of emitting laser light at a wavelength of 800 nm or more.

Particularly, in the case of an on-press development type lithographic printing plate precursor, the plate is always contacting with a fountain solution or an ink and, in a manner, in a development state during the plate is loaded on a printing press. Therefore, the image area is strongly demanded to have strength, but it is in principle difficult to impart on-press development resistance to the image area of a positive photosensitive material using ON-OFF as an intermolecular interaction. In this respect, use of a negative photosensitive material of forming a firm image by covalent bonding, particularly, a radical polymerization-system photosensitive material satisfied in both sensitivity and heat stability, is very effective. That is, the image recording layer of the present invention is suitably used particularly for an on-press development type lithographic printing plate precursor utilizing a radical polymerization system and when used, effects peculiar to the on-press development type lithographic printing plate precursor where the solubility or dispersibility in a fountain solution or an ink is important are exhibited and effects not easily presumable from past knowledge are exerted.

According to the present invention, a color image-forming material excellent in image visibility, storage stability and white light stability can be provided, and an on-press development type or non-processing (non-development) type lithographic printing plate precursor having high sensitivity and high press life and being excellent in the image visibility, on-press developability, storage stability and white light stability can be provided.

DETAILED DESCRIPTION OF THE INVENTION

The printing plate precursor capable of printing by loading the plate on a printing press without passing through a development processing step after image recording or by performing image recording after loading the plate on a printing press, as used in the present invention, includes (1) an on-press development type lithographic printing plate precursor and (2) a non-processing (non-development) type lithographic printing plate precursor, and these are described below.

(1) On-Press Development Type Lithographic Printing Plate Precursor:

A lithographic printing plate precursor having a photosensitive-thermosensitive layer of which solubility or dispersibility in a fountain solution and/or an ink is changed upon exposure or adhesion to an adjacent layer differing in the affinity for a fountain solution or an ink is changed upon exposure, and being developable by supplying a fountain solution and/or an ink to the plate surface on a printing press after image exposure.

(2) Non-Processing (Non-Development) Type Lithographic Printing Plate Precursor:

A lithographic printing plate precursor having a photosensitive-thermosensitive layer of which affinity for a fountain solution or an ink is changed on the surface upon exposure, and allowing for printing without removing the photosensitive-thermosensitive layer after image exposure.

The lithographic printing plate precursor of the present invention, which allows for printing by loading it on a printing press without passing through a development processing step after image recording or by recording an image after loading it on a printing press, is not particularly limited as long as it is the above-described lithographic printing plate precursor of (1) or (2). However, as described later, in the on-press development type lithographic printing plate precursor, the photosensitive-thermosensitive layer does not necessarily have a crosslinked structure and therefore, the discoloring agent or discoloration system of undergoing color change upon exposure has higher mobility in the photosensitive-thermosensitive layer, as a result, the reactivity for color change is readily enhanced. Accordingly, an on-press development type lithographic printing plate is more preferred than the non-processing (non-development) type in which the photosensitive-thermosensitive layer has a crosslinked structure.

Specific examples of these lithographic printing plate precursors include the plate materials described in Japanese Patent No. 2,938,397, JP-A-2001-277740, JP-A-2001-277742, JP-A-2002-287334, JP-A-2001-96936, JP-A-2001-96938, JP-A-2001-180141, JP-A-2001-162960, International Publication Nos. WO00/16987 and WO01/39985 (each pamphlet), EP-A-990517, EP-A-1225041, U.S. Pat. No. 6,465,152, JP-A-6-317899, International Publication No. WO96/35143 (pamphlet), EP-A-652483, JP-A-10-10737, JP-A-11-309952 and U.S. Pat. Nos. 6,017,677 and 6,413,694.

The constituent elements of the lithographic printing plate precursor of the present invention are described in detail below.

In the lithographic printing plate precursor of the present invention, a dye (color forming element) in a metastable state created by the interaction of (B) and (C) is released from the interaction or changed in the interacted state due to heat generated from an infrared absorbent as a light-to-heat conversion material upon laser exposure and this causes change in the structure of the color forming element and in turn in the color hue, whereby a difference in the color hue or lightness between the exposed area and the unexposed area, a so-called printout image, is produced and good visibility is obtained.

In one constitution of the lithographic printing plate precursor of the present invention, one image recording layer is provided on a support and the image recording layer contains a radical polymerization initiator, a polymerizable compound and the like together with (A) an infrared absorbent (hereinafter, sometimes simply referred to as "(A)"), (B) and (C). In another constitution, a layer containing (A), (B) and (C) and a layer containing a radical polymerization initiator, a polymerizable compound and the like are separately provided as the image recording layer on a support.

The layer containing (A), (B) and (C) or the layer containing a radical polymerization initiator, a polymerizable compound and the like, whichever layer may be provided above, but in view of visibility of the image after exposure, the layer containing (A), (B) and (C) is preferably provided above. However, considering their functions, these layers need not be necessarily adjacent to each other but may be unadjacent.

(A) Infrared Absorbent

In the image recording layer of the present invention, an infrared absorbent is used so as to elevate the sensitivity to an infrared laser. The infrared absorbent has a function of converting the absorbed infrared ray into heat. The infrared absorbent for use in the present invention is a dye or pigment having an absorption maximum at a wavelength of 760 to 1,200 nm.

As for the dye, commercially available dyes and known dyes described in publications, for example, *Senryo Binran* (*Handbook of Dyes*), compiled by Yuki Gosei Kagaku Kyokai (1970), may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Preferred examples of the dye include cyanine dyes described in JP-A-58-125246, JP-A-59-84356 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, near infrared absorbing sensitizers described in U.S. Pat. No. 5,156,938 may be suitably used. Furthermore, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiapyrylium salts described in U.S. Pat. No. 4,283,475, and pyrylium compounds described in JP-B-5-13514 (the "JP-B" as used herein means an "examined Japanese patent publication") and JP-B-5-19702 may also be preferably used. Other preferred examples of the dye include near infrared absorbing dyes represented by formulae (I) and (II) of U.S. Pat. No. 4,756,993.

Other preferred examples of the infrared absorbing dye for use in the present invention include specific indolenine cyanine dyes described in JP-A-2002-278057, such as those set forth below.

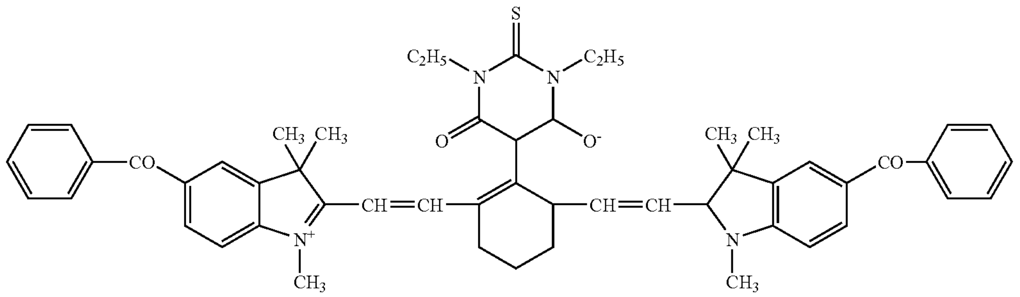

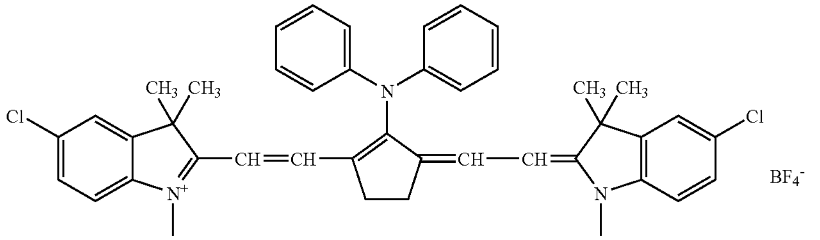

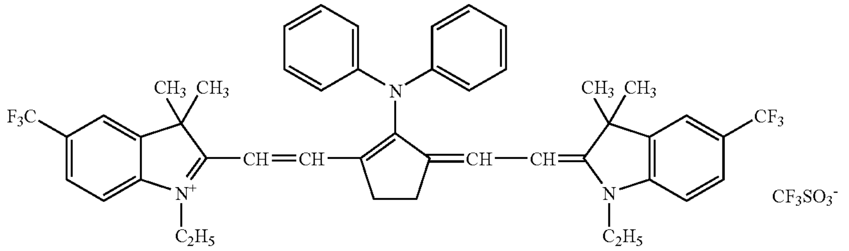

Among these dyes, particularly preferred are cyanine dyes, squarylium dyes, pyrylium salts, nickel thiolate complexes and indolenine cyanine dyes, more preferred are cyanine dyes and indolenine cyanine dyes, still more preferred are cyanine dyes represented by the following formula (I):

Formula (I):

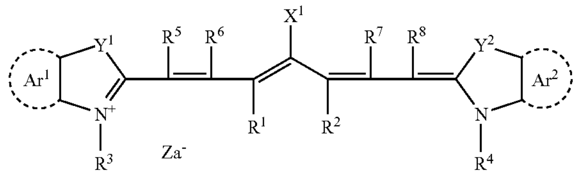

In formula (I), $X^1$ represents a hydrogen atom, a halogen atom, $—NPh_2$, $X^2—L^1$ or a group shown below:

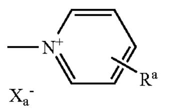

wherein $X^2$ represents an oxygen atom, a nitrogen atom or a sulfur atom, $L^1$ represents a hydrocarbon group having from 1 to 12 carbon atoms, an aromatic ring having a heteroatom, or a hydrocarbon group having from 1 to 12 carbon atoms and containing a heteroatom (the heteroatom as used herein indicates N, S, O, a halogen atom or Se), $X_a^-$ has the same definition as $Za^-$ described later, and $R^a$ represents a substituent selected from a hydrogen atom, an alkyl group, an aryl group, a substituted or unsubstituted amino group and a halogen atom.

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 or more carbon atoms, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring. Preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms, and in view of availability of the raw material, preferably a hydrogen atom. $Za^-$ represents a counter anion, but when the cyanine dye represented by formula (I) has an anionic substituent in its structure and neutralization of electric charge is not necessary, $Za^-$ is not present. In view of storage stability of the coating solution for the recording layer, $Za^-$ is preferably halogen ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (I), which can be suitably used in the present invention, include those described in paragraphs [0017] to [0019] of JP-A-2001-133969.

Other particularly preferred examples include specific indolenine cyanine dyes described in JP-A-2002-278057.

As for the pigment used in the present invention, commercially available pigments and pigments described in *Color Index* (*C.I.*) *Binran* (*C.I. Handbook*), *Saishin Ganryo Binran* (*Handbook of Newest Pigments*), compiled by Nippon Ganryo Gijutsu Kyokai (1977), *Saishin Ganryo Oyo Gijutsu* (*Newest Pigment Application Technology*), CMC Shuppan (1986), and *Insatsu Ink Gijutsu* (*Printing Ink Technology*), CMC Shuppan (1984) can be used.

The kind of the pigment includes black pigment, yellow pigment, orange pigment, brown pigment, red pigment, violet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black. Among these pigments, carbon black is preferred.

These pigments may or may not be surface-treated before use. Examples of the method for surface treatment include a method of coating the surface with resin or wax, a method of attaching a surfactant, and a method of bonding a reactive substance (for example, silane coupling agent, epoxy compound or isocyanate) to the pigment surface. These surface treatment methods are described in *Kinzoku Sekken no Seishitsu to Oyo* (*Properties and Application of Metal Soap*), Saiwai Shobo, *Insatsu Ink Gijutsu* (*Printing Ink Technology*), CMC Shuppan (1984), and *Saishin Ganryo Oyo Gijutsu* (*Newest Pigment Application Technology*), CMC Shuppan (1986).

The particle diameter of the pigment is preferably from 0.01 to 10 μm, more preferably from 0.05 to 1 μm, still more preferably from 0.1 to 1 μm. Within this range, good stability of the pigment dispersion in the coating solution for the image recording layer and good uniformity of the image recording layer can be obtained.

For dispersing the pigment, known dispersion techniques used in the production of ink or toner may be used. Examples of the dispersing machine include ultrasonic disperser, sand mill, attritor, pearl mill, super-mill, ball mill, impeller, disperser, KD mill, colloid mill, dynatron, three-roll mill and pressure kneader. These are described in detail in *Saishin Ganryo Oyo Gijutsu* (*Newest Pigment Application Technology*), CMC Shuppan (1986).

The infrared absorbent may be added together with other components in the same layer or may be added to a layer provided separately. Also, the infrared absorbent may be enclosed in a microcapsule and then added.

As for the amount added, the infrared absorbent is preferably added such that when a negative lithographic printing plate precursor is produced, the absorbancy of the image recording layer at a maximum absorption wavelength in the wavelength range of 760 to 1,200 nm is from 0.3 to 1.2, more preferably from 0.4 to 1.1, as measured by a reflection measuring method. Within this range, a uniform polymerization reaction proceeds in the depth direction of the image recording layer and the image area can have good film strength and good adhesion to the support.

The absorbancy of the image recording layer can be adjusted by the amount of the infrared absorbent added to the image recording layer and the thickness of the image recording layer. The absorbancy can be measured by an ordinary method. Examples of the measuring method include a method where an image recording layer having a thickness appropriately decided within the range of the dry coated amount necessary as a lithographic printing plate is formed on a reflective support such as aluminum and the reflection density is measured by an optical densitometer, and a method of measuring the absorbancy by a spectrophotometer according to a reflection method using an integrating sphere.

(B) Cyclic Color-Forming Compound

In the image recording layer of the present invention, a cyclic color-forming compound is used.

The cyclic color-forming compound is a compound having a cyclic structure within the molecule and forming a dye resulting from ring opening.

The cyclic color-forming compound is preferably a compound selected from the group consisting of the compounds represented by the following formulae (I) to (IV).

(I)

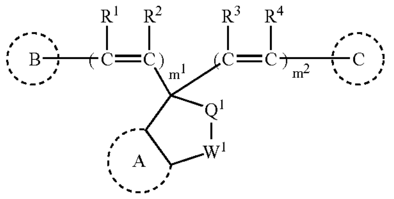

(wherein the rings A, B and C each independently represents a mono-, di- or tri-nuclear aromatic hydrocarbon group which may have a substituent, or a mono-, di- or tri-nuclear aromatic heterocyclic group which may have a substituent, $W^1$ represents a carbonyl group, a thiocarbonyl group or a group —$C(R^{25})$=N—, $R^{25}$ represents a hydrogen atom or a hydrocarbon group which may have a substituent, $Q^1$ represent an oxygen atom, a sulfur atom or an imino group which may have a substituent, $R^1$ to $R^4$ each independently represents a hydrogen atom or a hydrocarbon group which may have a substituent, $m^1$ represents 0 or 1, $m^2$ represents 0 or 1, and the rings B and C may combine with each other through a binding group, with the proviso that the ring B and/or the ring C have at least one substituent selected from an amino group which may have a substituent, an alkoxy group which may have a substituent, an aryloxy group which may have a substituent, an alkylthio group which may have a substituent, and an arylthio group which may have a substituent).

(II)

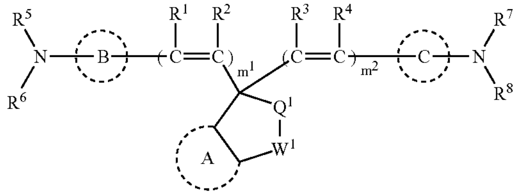

(wherein the rings A, B and C each independently represents a mono-, di- or tri-nuclear aromatic hydrocarbon group which may have a substituent, or a mono-, di- or tri-nuclear aromatic heterocyclic group which may have a substituent, $W^1$ represents a carbonyl group, a thiocarbonyl group or a group —$C(R^{25})$=N—, $R^{25}$ represents a hydrogen atom or a hydrocarbon group which may have a substituent, $Q^1$ represent an oxygen atom, a sulfur atom or an imino group which may have a substituent, $R^1$ to $R^4$ each independently represents a hydrogen atom or a hydrocarbon group which may have a substituent, $m^1$ represents 0 or 1, $m^2$ represents 0 or 1, $R^5$ to $R^8$ each independently represents a hydrogen atom, a hydrocarbon group which may have a substituent, or an acyl group which may have a substituent, the rings B and C may combine with each other through a binding group, $R^5$ or $R^6$ and the ring B may combine with each other through a binding group, and $R^7$ or $R^8$ and the ring C may combine with each other through a binding group).

Among the cyclic color-forming compounds represented by formulae (I) and (II), preferred are the compounds where $Q^1$ is an oxygen atom or a sulfur atom, $W^1$ is a carbonyl group or a thiocarbonyl group, the ring A is a benzene ring, a piperazine ring, a thiophene ring, a benzothiophene ring, a furan ring, a benzofuran ring, an indole ring or a pyridine ring, the rings B and C each is a benzene ring or a naphthalene ring, $m^1$ and $m^2$ each is 0 or 1, $R^1$ to $R^4$ each is independently a hydrogen atom, an alkyl group having from 1 to 5 carbon atoms or an aryl group having 6 to 8 carbon atoms, and $R^{25}$ is a hydrogen atom, an alkyl group having from 1 to 15 carbon atoms or an aryl group having from 6 to 15 carbon atoms, and more preferred are the compounds where $Q^1$ is an oxygen atom, $W^1$ is a carbonyl group, the ring A is a benzene ring, $R^1$ to $R^4$ each is independently a hydrogen atom, a methyl group, an ethyl group or a phenyl group.

The rings A, B and C each may have a substituent which does not inhibit the delocalized cationic structure produced, and specific examples of the substituent include a hydrogen atom, a hydroxyl group, a halogen atom, a cyano group, a trimethylsilyloxy group, an alkyl group having from 1 o 15 carbon atoms, which may have a substituent, an acyl group having from 2 to 15 carbon atoms, which may have a substituent, an alkoxy group having from 1 to 15 carbon atoms, which may have a substituent, an alkylthio group having from 1 to 15 carbon atoms, which may have a substituent, an alkylsulfinyl group having from 1 to 15 carbon atoms, which may have a substituent, an alkylsulfonyl group having from 1 to 15 carbon atoms, which may have a substituent, an aryloxy group having from 6 to 15 carbon atoms, which may have a substituent, an arylthio group having from 6 to 15 carbon atoms, which may have a substituent, an acyloxy group having from 2 to 15 carbon atoms, which may have a substituent, an alkoxycarbonyl group having from 2 to 15 carbon atoms, which may have a substituent, and an amino group which may have a substituent. Among these, preferred are a hydrogen atom, a hydroxyl group, a chlorine atom, a bromine atom, a trifluoromethyl group, an alkyl group having from 1 to 10 carbon atoms, a phenyl group, a tolyl group, an acyl group having from 2 to 5 carbon atoms, an acyloxy group having from 2 to 5 carbon atoms, a dialkylamino group having from 1 to 5 carbon atoms, an alkylamino group having from 1 to 5 carbon atoms, a phenylamino group, a phenylmethylamino group, an alkoxy group having from 1 to 5 carbon atoms, an alkylthio group having from 1 to 5 carbon atoms, a phenoxy group and a phenylthio group.

The rings B and C may combine with each other through a binding group and examples of the binding group include an oxygen atom, a sulfur atom, a methylene group and an ethylene group. The binding group is preferably an oxygen atom. When the rings B and C are combined, it is more preferred that $m^1$ and $m^2$ both are 0 and the rings B and C are combined at the o-position to form a 6-membered ring. In formula (I), the ring B and/or the ring C have at least one substituent selected from an amino group which may have a substituent, an alkoxy group which may have a substituent, an aryloxy group which may have a substituent, an alkylthio group which may have a substituent, and an arylthio group which may have a substituent, but the ring B and the ring C each preferably has at least one of these substituents. It is more preferred that the ring B and the ring C each has at least one amino group which may have a substituent, and this compound corresponds to formula (II).

In the cyclic color-forming compound represented by formula (II), $R^5$ to $R^8$ each is independently preferably a hydrogen atom, an alkyl group having from 1 to 10 carbon atoms, a cycloalkyl group having from 5 to 7 carbon atoms, an aryl group having 6 to 10 carbon atoms, which may be substituted by a halogen atom or a trifluoromethyl group, or an alkoxyalkyl group having from 2 to 7 carbon atoms, and more preferably a hydrogen atom, a methyl group, an ethyl group, a 1-propyl group, a 2-propyl group, a 1-butyl group, a 2-butyl group, a 1-pentyl group, a 2-pentyl group, a 2-methyl-1-propyl group, a cyclohexyl group, a phenyl group, a tolyl group or a 3-trifluorophenyl group.

(III)

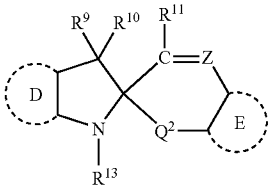

(wherein the rings D and E each independently represents a mono-, di- or tri-nuclear aromatic hydrocarbon group which may have a substituent, or a mono-, di- or tri-nuclear aromatic heterocyclic group which may have a substituent, $Q^2$ represent an oxygen atom or a sulfur atom, $R^9$ to $R^{11}$ each independently represents a hydrogen atom, a halogen atom or a hydrocarbon group which may have a substituent, $R^{13}$ represents a hydrogen atom or a hydrocarbon group which may have a substituent, Z represents C—$R^{12}$ or N, and $R^{12}$ represents a hydrogen atom, a halogen atom or a hydrocarbon group which may have a substituent).

Among the cyclic color-forming compounds represented by formula (III), preferred are the compounds where $Q^2$ is an oxygen atom, the ring D is a benzene ring, a piperazine ring, a thiophene ring, a benzothiophene ring, a furan ring, a benzofuran ring, an indole ring or a pyridine ring, the ring E is a benzene ring or a naphthalene ring, $R^9$ to $R^{12}$ each is independently a hydrogen atom, an alkyl group having from 1 to 5 carbon atoms, which may be substituted by a halogen atom, or an aryl group having from 6 to 8 carbon atoms, which may be substituted by a halogen atom, and $R^{13}$ is a hydrogen atom, an alkyl group having from 1 to 5 carbon atoms or an aryl group having from 6 to 8 carbon atoms, and more preferred are the compounds where the ring D is a benzene ring, $R^9$ and $R^{10}$ each is a methyl group, $R^{11}$ and $R^{12}$ each is a hydrogen atom or a methyl group, and $R^{13}$ is a methyl group or an ethyl group. The rings D and E each may have a substituent which does not inhibit the delocalized cationic structure produced, and examples of the substituent are the same as those of the substituent described for the rings A, B and C in formulae (I) and (II).

(IV)

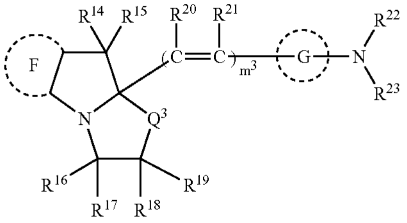

(wherein the rings F and G each independently represents a mono-, di- or tri-nuclear aromatic hydrocarbon group which may have a substituent, or a mono-, di- or tri-nuclear aromatic heterocyclic group which may have a substituent, $R^{14}$ to $R^{21}$ each independently represents a hydrogen atom or a hydrocarbon group which may have a substituent, $R^{22}$ and $R^{23}$ each independently represents a hydrogen atom, a hydrocarbon group which may have a substituent, or an acyl group which may have a substituent, $Q^3$ represent an oxygen atom or a sulfur atom, and $m^3$ represents 1 or 2).

Among the cyclic color-forming compounds represented by formula (IV), preferred are the compounds where $Q^3$ is an oxygen atom, the ring F is a benzene ring, a piperazine ring, a thiophene ring, a benzothiophene ring, a furan ring, a benzofuran ring, an indole ring or a pyridine ring, the ring G is a benzene ring or a naphthalene ring, $R^{14}$ to $R^{21}$ each is independently a hydrogen atom, an alkyl group having from 1 to 5 carbon atoms, an aryl group having from 6 to 8 carbon atoms or a halogen atom, $R^{22}$ and $R^{23}$ each is independently a hydrogen atom, an alkyl group having from 1 to 5 carbon atoms, an acyl group having from 2 to 6 carbon atoms, or an aryl group having from 6 to 8 carbon atoms, and more preferred are the compounds where the ring F is a benzene ring, $R^{14}$ and $R^{15}$ each is a methyl group, $R^{16}$ to $R^{21}$ each is independently a hydrogen atom or a methyl group, and $R^{22}$ and $R^{23}$ each is independently a hydrogen atom, a methyl group, an ethyl group or an acetyl group. The rings F and G each may have a substituent which does not inhibit the delocalized cationic structure produced, and examples of the substituent are the same as those of the substituent described above for the rings A, B and C.

Specific examples of the cyclic color-forming compounds are set forth below, but the present invention is not limited thereto.

X-1
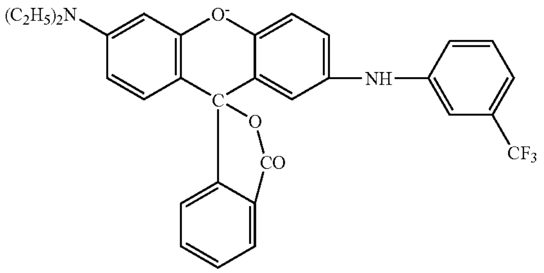
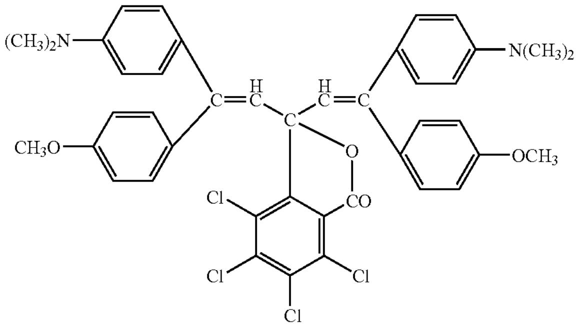
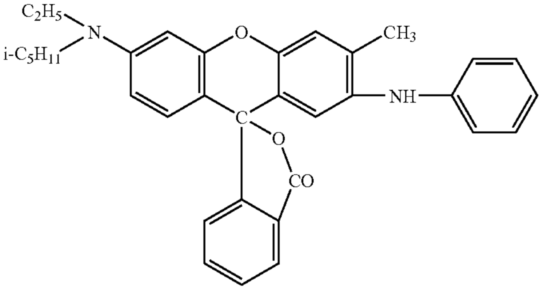
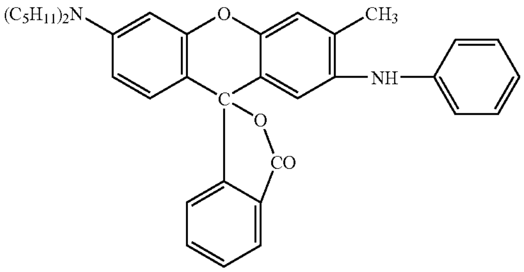
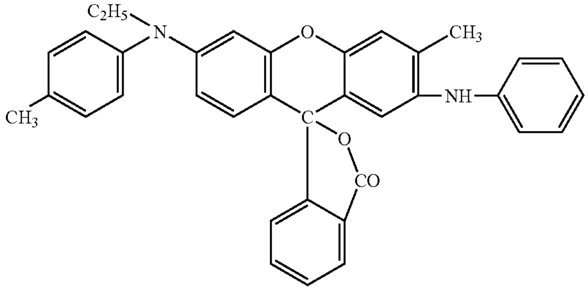
-continued
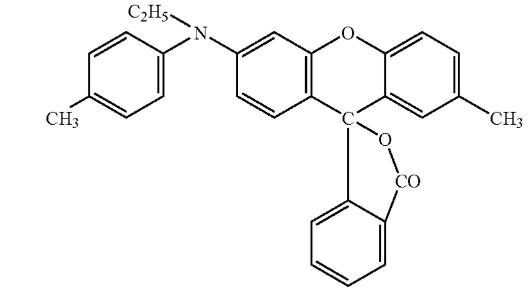
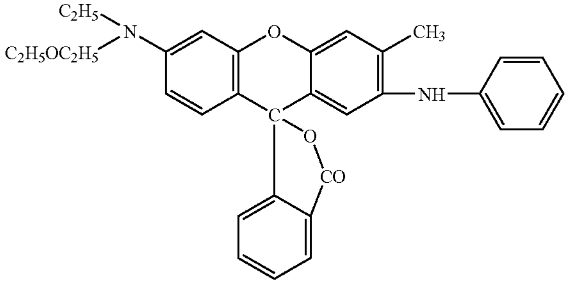
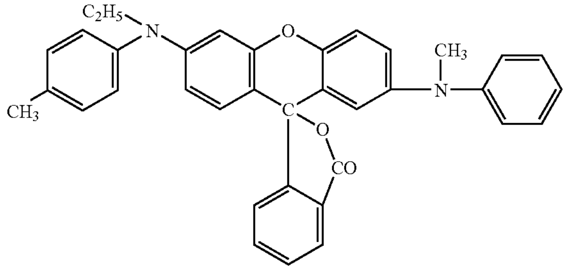
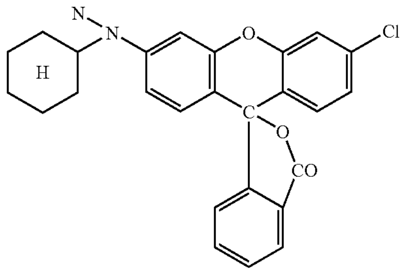
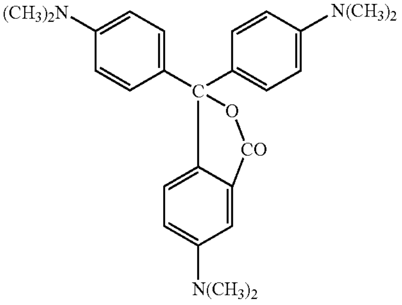
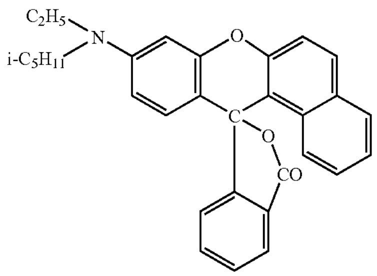

-continued
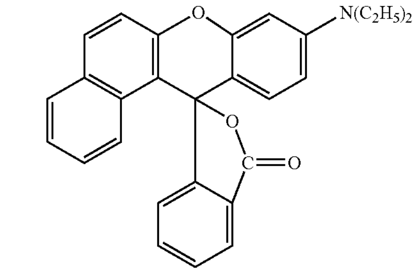
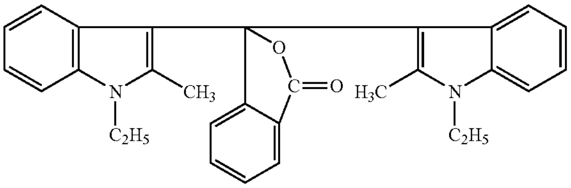
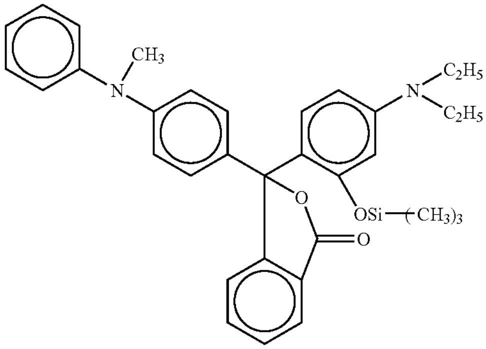
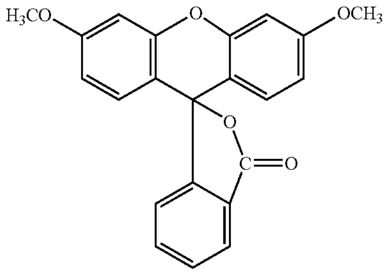
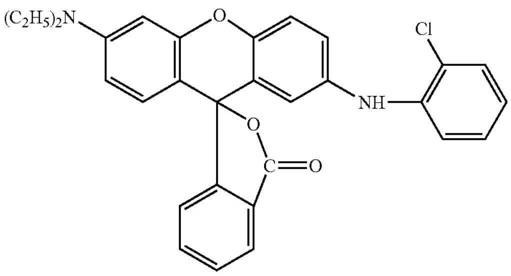
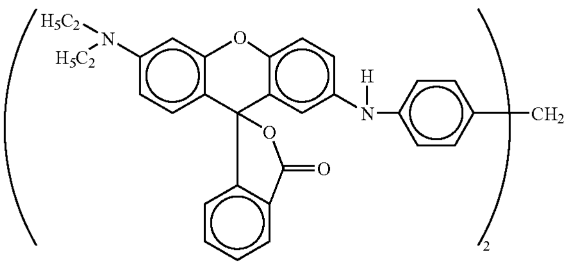
-continued
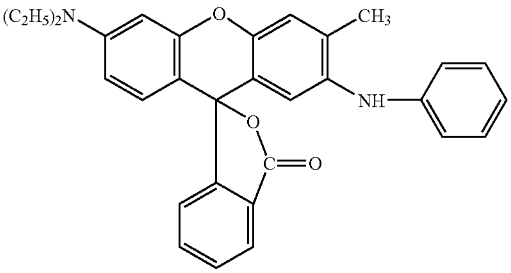
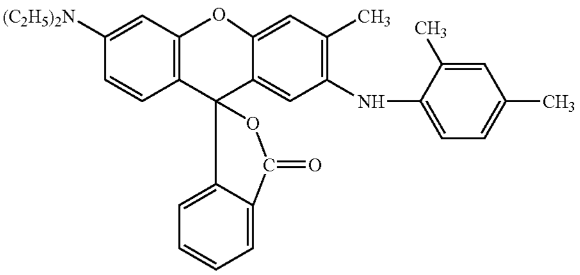
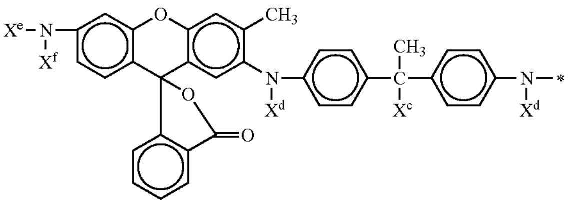
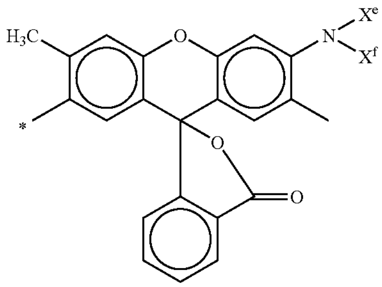
| | $X^d$ | $X^c$ | $X^e$ | $X^f$ |
|---|---|---|---|---|
| 1 | H | H |  | $CH_3$ |
| 2 | H | $-CH_3$ | " | " |
| 3 | $CH_3$ | H | " | " |
| 4 | $CH_3$ | $CH_3$ | " | " |
| 5 | H | $CH_3$ | $CH_3$ | $CH_3$ |

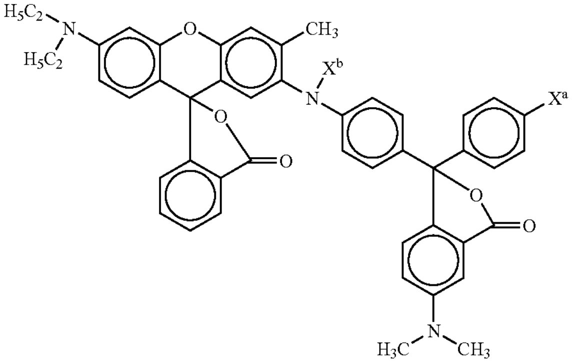
| | $X^a$ | $X^b$ |
|---|---|---|
| 1 | $O\underset{\underset{O}{\|}}{C}CH_3$ | H |
| 2 | OH | H |
| 3 | OH | $—CH_3$ |
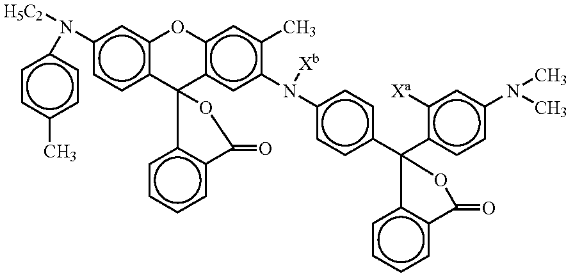
| | $X^a$ | $X^b$ |
|---|---|---|
| 1 | $O\underset{\underset{O}{\|}}{C}CH_3$ | H |
| 2 | OH | $CH_3$ |
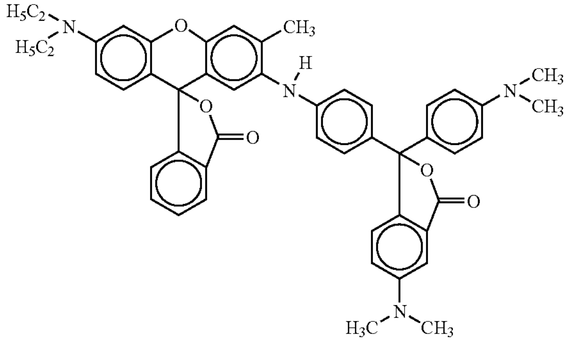
-continued
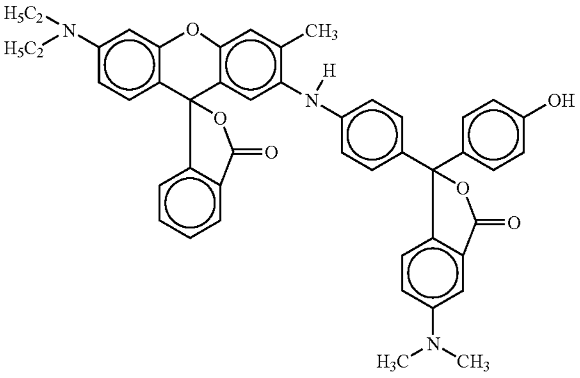
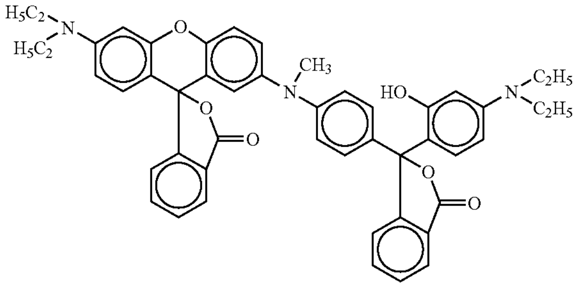
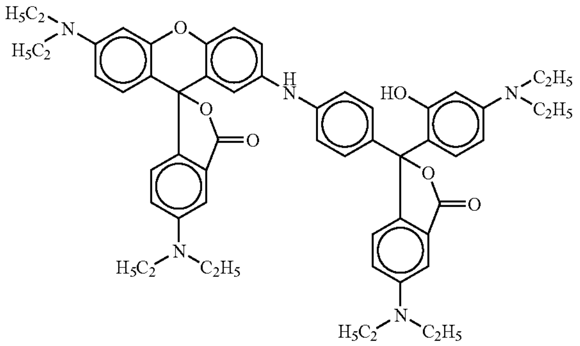
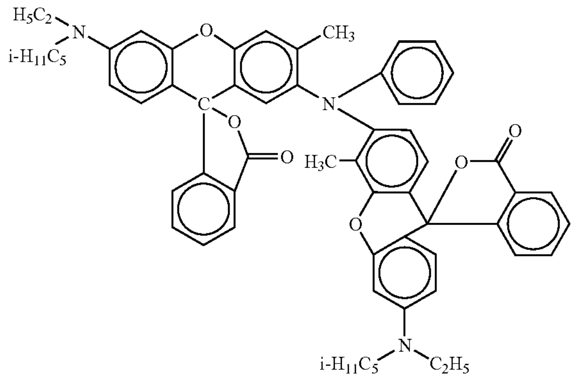
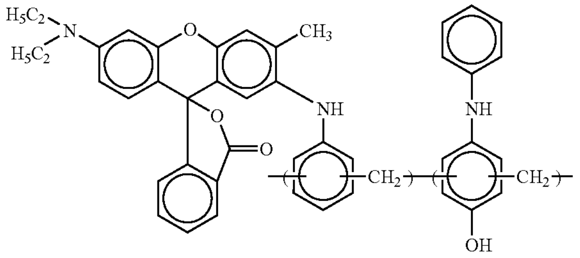
1:1 (by mol)

-continued
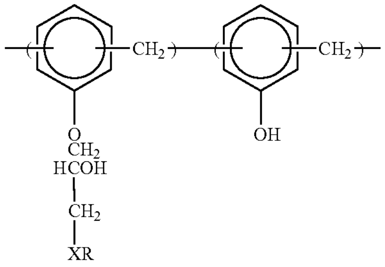
1:1 (by mol)
wherein XR represents:
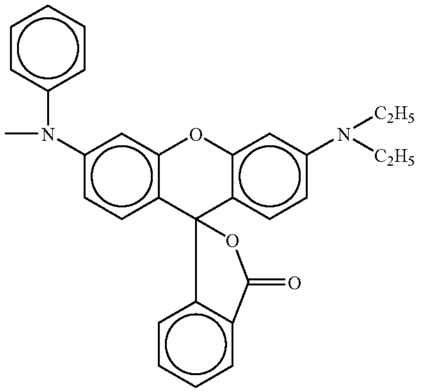
65:5:30 (by mol)
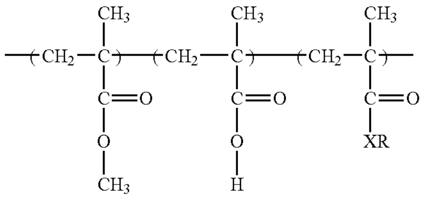
30:70 (by mol)
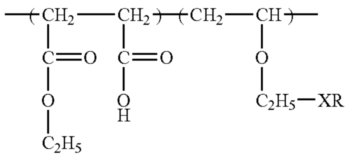
63:30:7 (by mol)
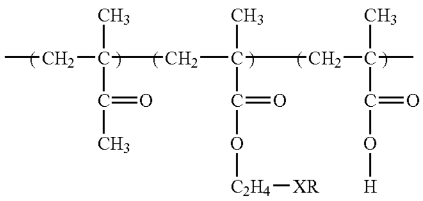
-continued
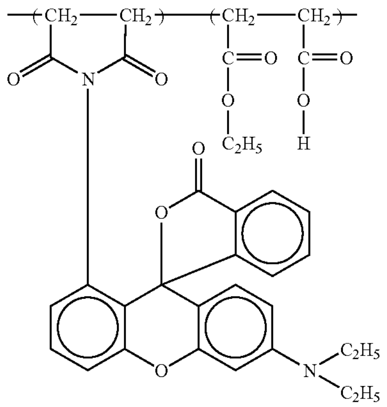
1:1 (by mol)
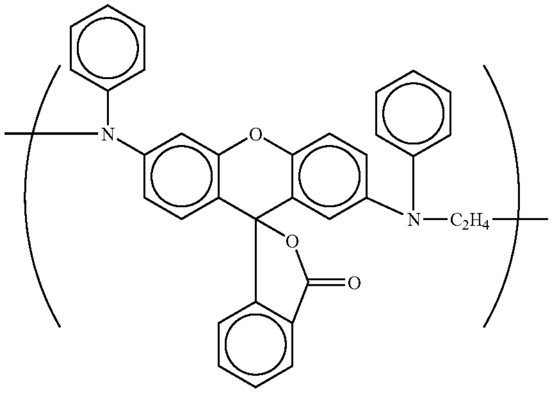
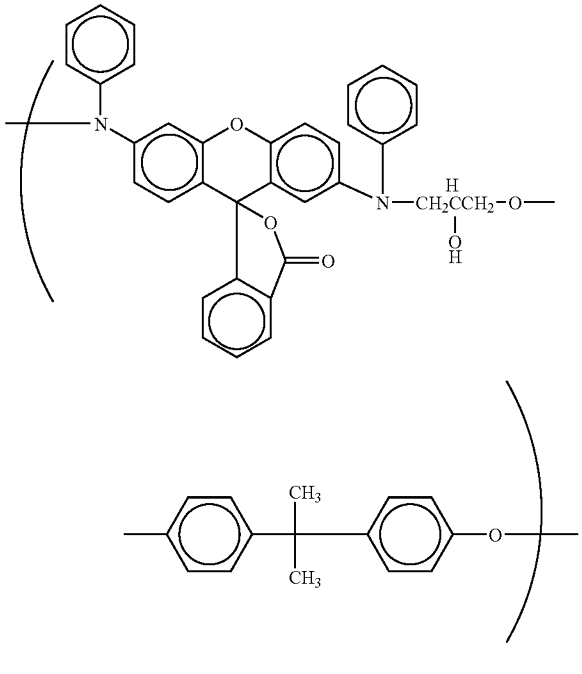

-continued

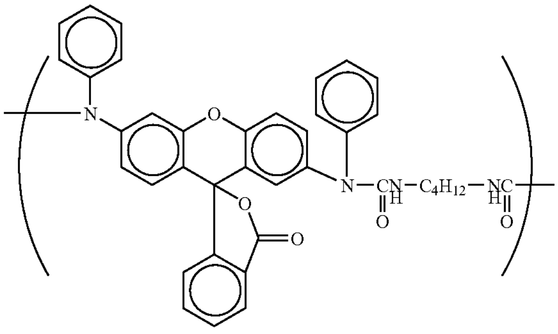

1:1:1 (by mol)

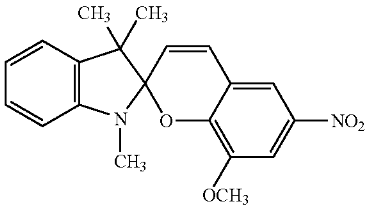

X-4

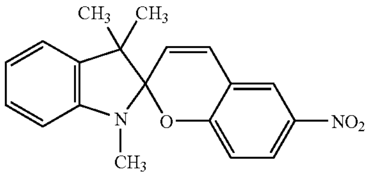

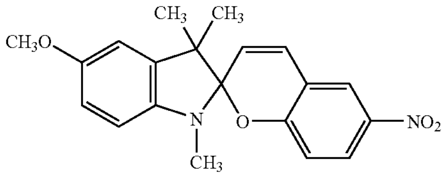

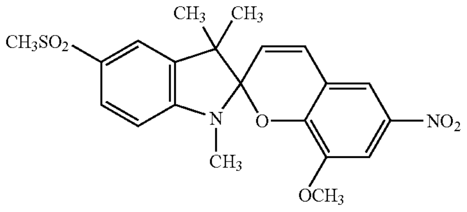

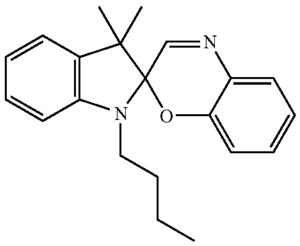

X-3

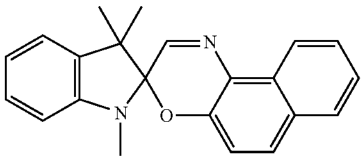

-continued

X-2

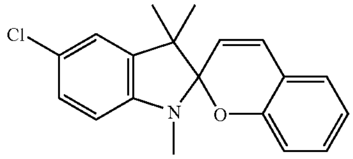

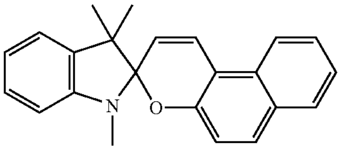

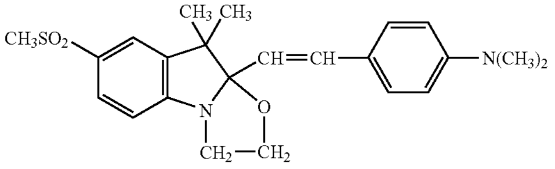

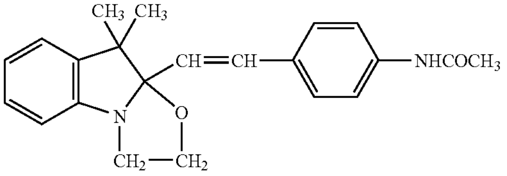

X-5

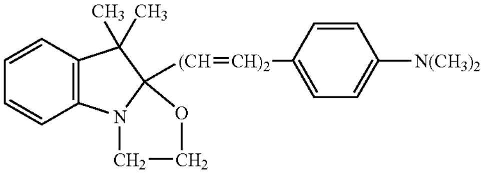

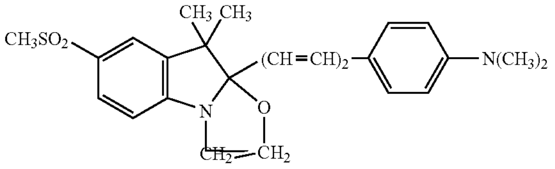

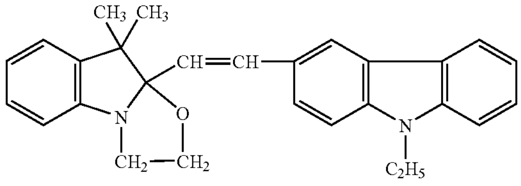

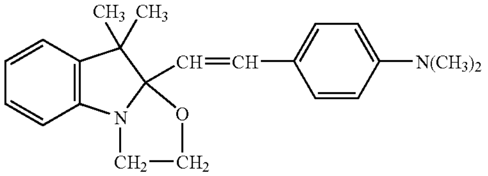

The content of the cyclic color-forming compound in the image recording layer is preferably from 0.1 to 25 mass %, more preferably from 1.0 to 10 mass %.

(C) Dye Stabilizer

In the image recording layer of the present invention, a dye stabilizer is used.

The dye stabilizer is a compound which interacts with the cyclic color-forming compound to stabilize the ring-opened dye body and cause color formation and which is released from the interaction upon laser exposure to decrease in the color formation.

Specific preferred examples thereof include compounds having an acid group and ionic compounds.

The compound having an acid group is preferably a compound having an acid group with pKa of 11 or less, more preferably a compound having an acid group with pKa of 7 or less.

The compound is still more preferably a compound selected from the group consisting of the compounds in i) to iv) below:

i) low molecular or polymer compounds having a phenolic OH group;

ii) low molecular or polymer compounds having a carboxylic acid group;

iii) low molecular or polymer compounds having a phosphoric acid group or a phosphonic acid group; and iv) low molecular or polymer compounds having a sulfonic acid group.

The ionic compound is preferably a compound having a salt structure of organic acid or inorganic acid.

The ionic compound is more preferably a compound selected from the group consisting of the compounds in a) to c) below:

a) low molecular or polymer compounds having a sulfonate structure;

b) low molecular or polymer compounds having a carboxylate structure; and c) low molecular or polymer compounds having an inorganic acid salt structure containing a halogen atom.

Examples of the salt (cation moiety) of an organic or inorganic acid include a salt with alkali metal and a salt with ammonium (e.g., ammonia, primary to quaternary amine).

Specific examples of the dye stabilizer are set forth below, but the present invention is not limited thereto.

[Dye Stabilizer]

Dye Stabilizers Belonging to i):

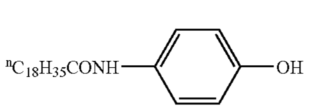

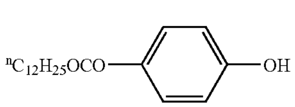

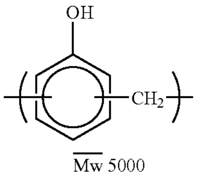

$\overline{Mw}$ 5000

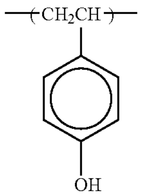

$\overline{Mw}$ 20000

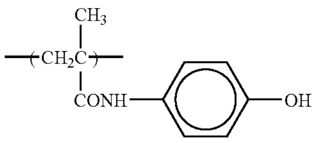

$\overline{Mw}$ 10000

Dye Stabilizers Belonging to ii):

$^{n}C_{18}H_{35}CO_2H$

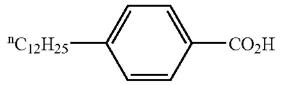

Y-2

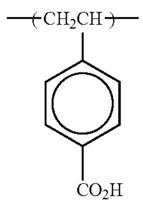

$\overline{Mw}$ 10000

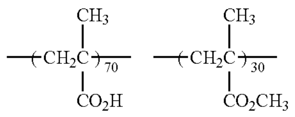

$\overline{Mw}$ 10000

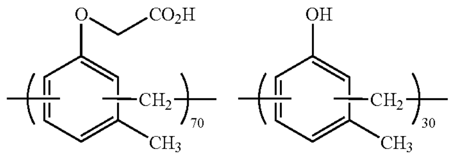

$\overline{Mw}$ 5000

Dye Stabilizers Belonging to iii):

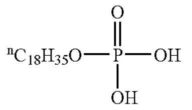

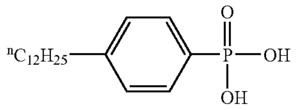

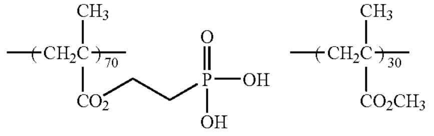

$\overline{Mw}$ 20000

Y-1

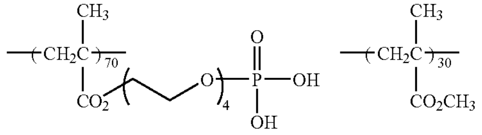

$\overline{Mw}$ 100000

Dye Stabilizers Belonging to iv):

$^{n}C_{18}H_{35}SO_3H$

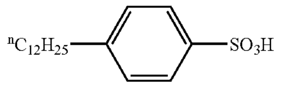

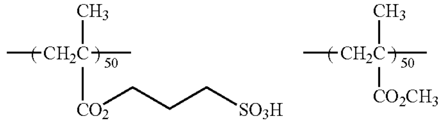

$\overline{Mw}$ 20000

-continued

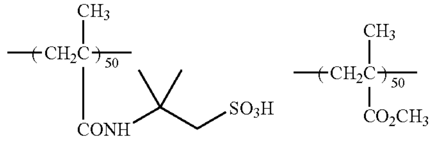

$\overline{Mw}$ 100000

Salt type:

Dye Stabilizers Belonging to a):

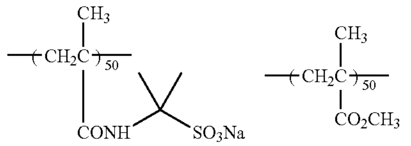

$\overline{Mw}$ 100000

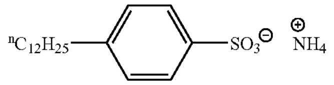

Dye Stabilizers Belonging to b):

$^nC_{18}H_{35}CO_2^{\ominus}$ $^{\oplus}N(CH_3)_4$

Y-3

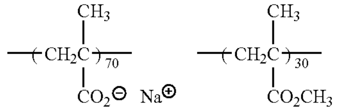

$\overline{Mw}$ 10000

Dye Stabilizers Belonging to c):

$(^nC_4H_9)_4N^{\oplus}$ $BF_4^{\ominus}$

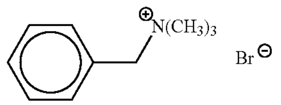

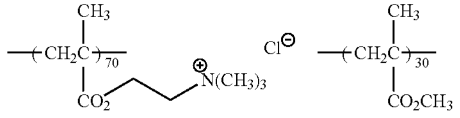

$\overline{Mw}$ 50000

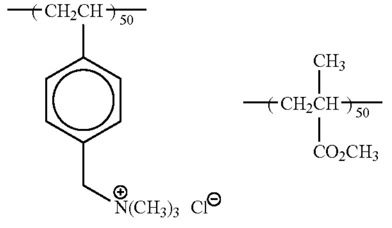

$\overline{Mw}$ 10000

The content of the dye stabilizer in the image recording layer is preferably from 1.0 to 90 mass %, more preferably from 5.0 to 70 mass %.

The dye body resulting from interaction of the cyclic color-forming compound (B) with the dye stabilizer (C) for use in the present invention can be formed, for example, by the heating in the process of coating a coating solution for image recording layer containing (B) a cyclic color-forming compound and (C) a dye stabilizer on a support, and heating and drying it to form an image recording layer. The heating temperature is preferably from 60 to 200° C., more preferably from 80 to 150° C., and the heating time is preferably from 5 seconds to 10 minutes, more preferably from 10 to 120 seconds.

[Elements for Forming Printed Image:]

In the image recording layer of the present invention, at least either one of (A) an image-forming element utilizing radical polymerization and (B) an image-forming element utilizing heat fusion or thermal reaction of a hydrophobization precursor can be used as the element which can be preferably used for forming a printed image. When the element (A) is used, a radical polymerization-type image recording layer is obtained, and when the element (B) is used, a hydrophobic precursor-type image recording layer is obtained. These elements are described below.

(A) Image-Forming Element Utilizing Radical Polymerization

The radical polymerization-type element has high sensitivity of image formation and can effectively distribute the exposure energy to the formation of a printout image and therefore, this element is suitable for obtaining a printout image having good visibility. The fundamental components of the radical polymerization-type element are a radical polymerizable compound and a radical polymerization initiator.

<Radical Polymerizable Compound>

The radical polymerizable compound (hereinafter sometimes simply referred to as a "polymerizable compound") which can be used in the present invention is an addition-polymerizable compound having at least one ethylenically unsaturated double bond and is selected from compounds having at least one, preferably two or more, ethylenically unsaturated bond(s). Such compounds are widely known in this industrial field and these known compounds can be used in the present invention without any particular limitation. These compounds have a chemical mode such as monomer, prepolymer (that is, dimer, trimer or oligomer) or a mixture or copolymer thereof. Examples of the monomer and its copolymer include unsaturated carboxylic acids (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, addition reaction products of an unsaturated carboxylic acid ester or amide having a nucleophilic substituent such as hydroxyl group, amino group or mercapto group with a monofunctional or polyfunctional isocyanate or epoxy, and dehydrating condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, amine or thiol, and displacement reaction products of an unsaturated carboxylic acid ester or amide having a disorptive substituent such as halogen group or tosyloxy group with a monofunctional or polyfunctional alcohol, amine or thiol may also be suitably used. Also, compounds where the unsaturated carboxylic acid of the above-described compounds is replaced by an unsaturated phosphonic acid, styrene, vinyl ether or the like, may be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Other examples of the ester include aliphatic alcohol-based esters described in JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. Other preferred examples of the amide-type monomer include those having a cyclohexylene structure described in JP-B-54-21726.

A urethane-based addition-polymerizable compound produced by using an addition reaction of isocyanate with a hydroxyl group is also preferred and specific examples thereof include vinyl urethane compounds having two or more polymerizable vinyl groups within one molecule described in JP-B-48-41708, which are obtained by adding a vinyl monomer having a hydroxyl group represented by the following formula (a) to a polyisocyanate compound having two or more isocyanate groups within one molecule:

$$CH_2{=}C(R_4)COOCH_2CH(R_5)OH \qquad (a)$$

(wherein $R_4$ and $R_5$ each represents H or $CH_3$).

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used. Furthermore, when addition-polymerizable compounds having an amino or sulfide structure within the molecule described in JP-A-63-277653, JP-A-63-260909 and JP-A-1-105238 are used, a photopolymerizable composition having very excellent photosensitization speed can be obtained.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-based compounds described in JP-A-2-25493 may be used. In some cases, structures containing a perfluoroalkyl group described in JP-A-61-22048 are suitably used. Furthermore, those described as a photocurable monomer or oligomer in *Adhesion,* Vol. 20, No. 7, pp. 300–308 (1984) may also be used.

Details of the use method of these polymerizable compounds, such as structure, sole or combination use and amount added, can be freely selected in accordance with the designed performance of the final lithographic printing plate precursor and, for example, may be selected from the following standpoints.

In view of sensitivity, a structure having a large unsaturated group content per one molecule is preferred and in most cases, a bifunctional or greater polyfunctional compound is preferred. For increasing the strength of image part, namely, cured layer, a trifunctional or greater polyfunctional compound is preferred. Also, a method of controlling both sensitivity and strength by using a combination of compounds differing in the functional number or in the polymerizable group (for example, an acrylic acid ester, a methacrylic acid ester, a styrene-based compound or a vinyl ether-based compound) is effective.

The selection and use method of the addition-polymerizable compound are important factors also for the compatibility and dispersibility with other components (e.g., binder polymer, initiator, colorant) in the image recording layer. For example, the compatibility may be improved in some cases by using a low purity compound or using two or more compounds in combination. Also, a specific structure may be selected for the purpose of improving the adhesion to the substrate, protective layer which is described later, or the like.

The polymerizable compound is preferably used in an amount of 5 to 80 mass %, more preferably from 25 to 75 mass %, based on the nonvolatile components in the image recording layer. Also, these polymerizable compounds may be used individually or in combination of two or more thereof. Other than these, as for the use method of the polymerizable compound, appropriate structure, formulation and amount added can be freely selected by taking account of the degree of polymerization inhibition due to oxygen, resolution, fogging, change in refractive index, surface tackiness and the like. Depending on the case, a layer structure or coating method such as undercoat and overcoat can also be employed.

<Radical Initiator>

The radical initiator for use in the present invention is a compound of generating a radical by the effect of either one or both of light and heat energies. This radical initiator has a function of initiating or accelerating polymerization of the radical polymerizable compound.

Examples of the radical initiator which can be used in the present invention include known thermopolymerization initiators, compounds having a bond small in the bond-dissociation energy, photopolymerization initiators, and known radical generators called a photo-oxidizing agent or a printing-out agent. Among these, the radical initiator suitably used in the present invention is a compound of generating a radical by the effect of heat energy.

The radical initiator for use in the present invention is described in more detail below and these radical initiators can be used individually or in combination of two or more thereof.

Examples of the radical initiator include organohalogen compounds, carbonyl compounds, organic peroxides, azo-based compounds, azide compounds, metallocene compounds, hexaarylbiimidazole compounds, organoboron compounds, disulfone compounds, oxime ester compounds and onium salt compounds.

Specific examples of the organohalogen compound include the compounds described in Wakabayashi et al., *Bull. Chem. Soc. Japan,* 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339, and M. P. Hutt, *Journal of Heterocyclic Chemistry,* 1, No. 3 (1970). Among these, oxazole compounds substituted with a trihalomethyl group and s-triazine compounds are preferred.

More preferred are s-triazine derivatives where at least one mono-, di- or trihalogenated methyl group is bonded to the s-triazine ring. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone and 1,1,1-trichloromethyl-(p-butylphenyl)ketone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone and 2,4-diisopropylthioxanthone; and benzoic acid ester derivatives such as ethyl p-dimethylaminobenzoate and ethyl p-diethylaminobenzoate.

Examples of the azo-based compound which can be used include azo compounds described in JP-A-8-108621.

Examples of the organic peroxide include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxydicarbonate, di-2-ethylhexylperoxydicarbonate, di-2-ethoxyethylperoxydicarbonate, dimethoxyisopropylperoxycarbonate, di(3-methyl-3-methoxybutyl)peroxydicarbonate, tert-butylperoxyacetate, tert-butylperoxypivalate, tert-butylperoxyneodecanoate, tert-butylperoxyoctanoate, tert-butylperoxylaurate, tert-carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogendiphthalate) and carbonyl di(tert-hexylperoxydihydrogendiphthalate).

Examples of the metallocene compound include various titanocene compounds described in JP-A-59-152396, JP-A-61-151197, JP-A-63-41484, JP-A-2-249, JP-A-2-4705 and JP-A-5-83588, such as dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl, and iron-allene complexes described in JP-A-1-304453 and JP-A-1-152109.

Examples of the hexaarylbiimidazole compound include various compounds described in JP-B-6-29285 and U.S. Pat. Nos. 3,479,185, 4,311,783 and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

Examples of the organoboron compound include organic borates described in JP-A-62-143044, JP-A-62-150242, JP-A-9-188685, JP-A-9-188686, JP-A-9-188710, JP-A-2000-131837, JP-A-2002-107916, Japanese Patent No. 2764769, JP-A-2002-116539, and Martin Kunz, *Rad Tech.*

'98. *Proceeding* Apr. 19–22, 1998, Chicago; organic boron sulfonium complexes and organic boron oxosulfonium complexes described in JP-A-6-157623, JP-A-6-175564 and JP-A-6-175561; organic boron iodonium complexes described in JP-A-6-175554 and JP-A-6-175553; organic boron phosphonium complexes described in JP-A-9-188710; and organic boron transition metal coordination complexes described in JP-A-6-348011, JP-A-7-128785, JP-A-7-140589, JP-A-7-306527 and JP-A-7-292014.

Examples of the disulfone compound include compounds described in JP-A-61-166544 and JP-A-2002-328465.

Examples of the oxime ester compound include the compounds described in *J.C.S. Perkin II,* 1653–1660 (1979), *J.C.S. Perkin II,* 156–162 (1979), *Journal of Photopolymer Science and Technology,* 202–232 (1995), JP-A-2000-66385 and JP-A-2000-80068. Specific examples thereof include the compounds represented by the following structural formulae.

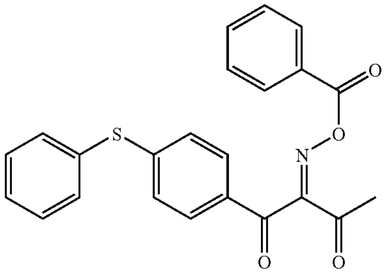

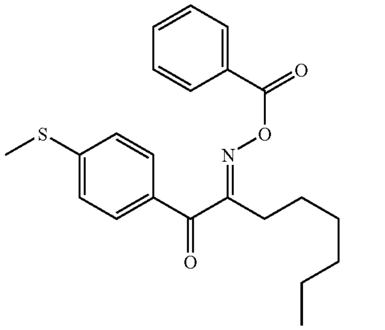

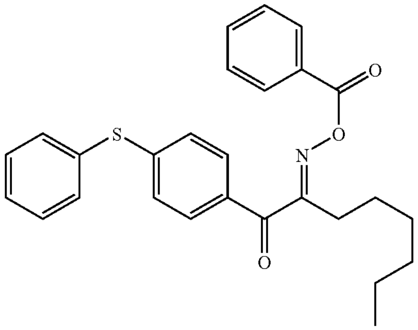

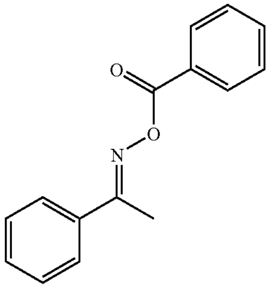

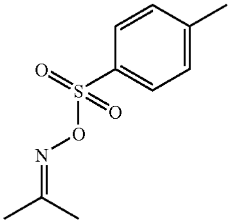

-continued

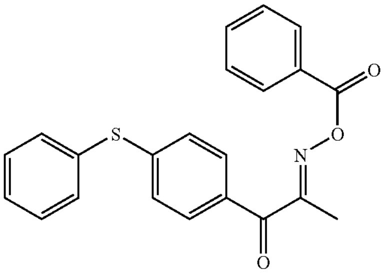

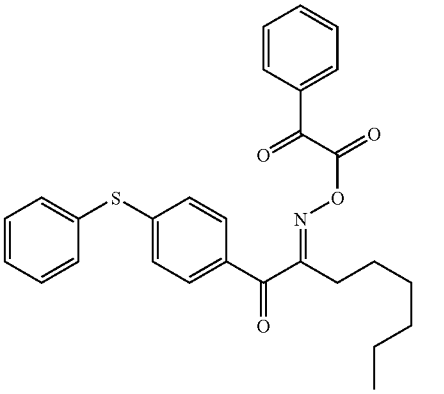

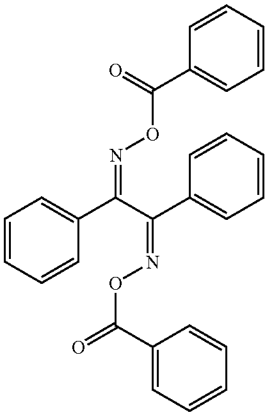

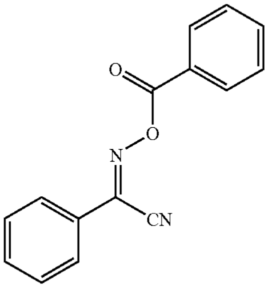

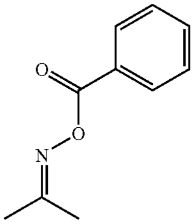

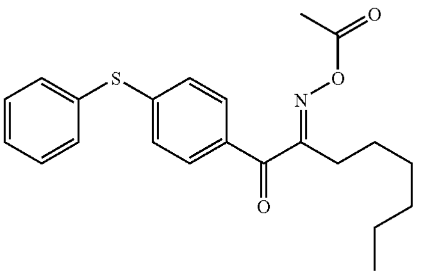

-continued

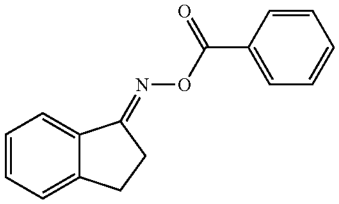

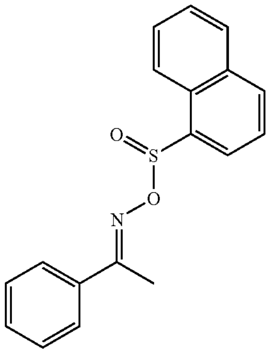

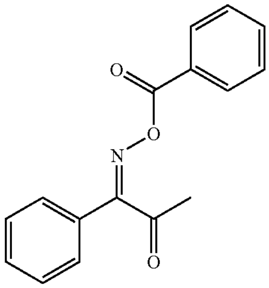

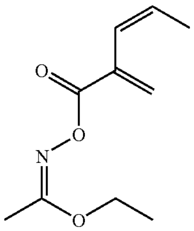

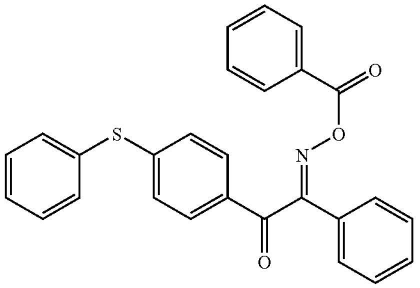

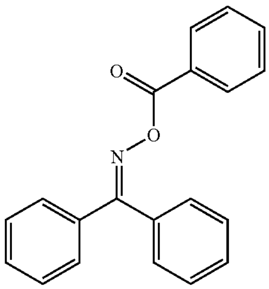

-continued

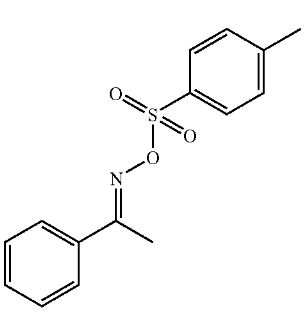

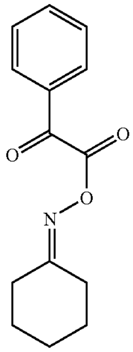

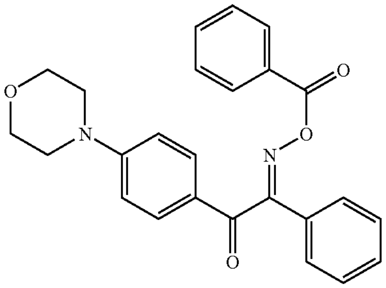

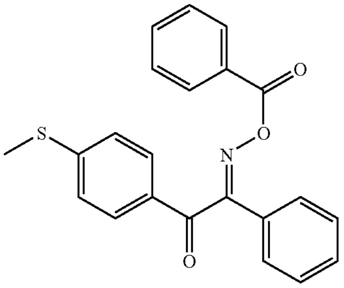

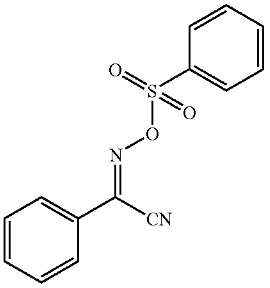

Examples of the onium salt compound include onium salts such as diazonium salts described in S. I. Schlesinger, *Photogr. Sci. Eng.,* 18, 387 (1974) and T. S. Bal et al., *Polymer,* 21, 423 (1980); ammonium salts described in U.S. Pat. No. 4,069,055 and JP-A-4-365049; phosphonium salts described in U.S. Pat. Nos. 4,069,055 and 4,069,056; iodonium salts described in European Patent 104,143, U.S. Pat. Nos. 339,049 and 410,201, JP-A-2-150848 and JP-A-2-296514; sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827, and German Patents 2,904,626, 3,604,580 and 3,604,581; selenonium salts described in J. V. Crivello et al., *Macromolecules,* 10 (6), 1307 (1977) and J. V. Crivello et al., *J. Polymer Sci.,* Polymer Chem. Ed., 17, 1047 (1979); and arsonium salts described in C. S. Wen et al., *Teh. Proc. Conf. Rad. Curing ASIA,* p. 478 (Tokyo, October 1988).

Among these, the oxime ester compounds and onium salts (diazonium salts, iodonium salts and sulfonium salts) are particularly preferred in view of reactivity and stability.

The onium salt suitably used in the present invention is an onium salt represented by any one of the following formulae (RI-I) to (RI-III):

(RI-I)

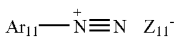

(RI-II)

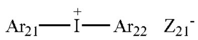

(RI-III)

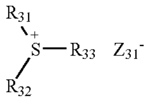

In formula (RI-I), $Ar_{11}$ represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamide or arylamide group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{11}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability are perchlorate ion, hexafluorophosphate ion, tetrafluoroborate ion, sulfonate ion and sulfinate ion.

In formula (RI-II), $Ar_{21}$ and $Ar_{22}$ each independently represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{21}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability and reactivity are perchlorate ion, hexafluorophosphate ion, tetrafluoroborate ion, sulfonate ion, sulfinate ion and carboxylate ion.

In formula (RI-III), $R_{31}$, $R_{32}$ and $R_{33}$ each independently represents an aryl, alkyl, alkenyl or alkynyl group having 20 or less carbon atoms, which may have from 1 to 6 substituent(s), and in view of reactivity and stability, preferably an aryl group. Examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{31}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability and reactivity are perchlorate ion, hexafluorophosphate ion, tetrafluoroborate ion, sulfonate ion, sulfinate ion and carboxylate ion, more preferred is carboxylate ion described in JP-A-2001-343742, still more preferred is carboxylate ion described in JP-A-2002-148790.

Specific examples of the onium salts represented by formulae (RI-I) to (RI-III) are set forth below, but the present invention is not limited thereto.

(N-1)

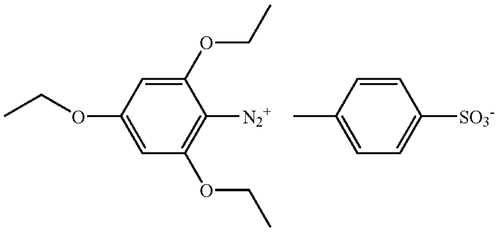

(N-2)

$PF_6^-$ (N-3)

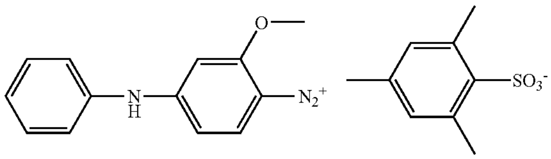

(N-4)

$ClO_4^-$ (N-5)

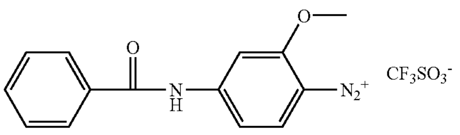

(N-6)

$BF_4^-$

-continued
(N-7)
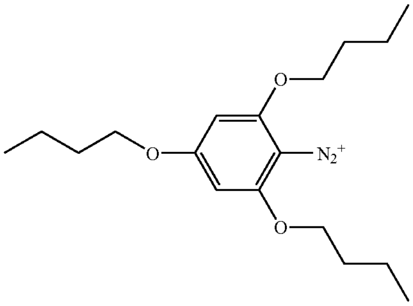
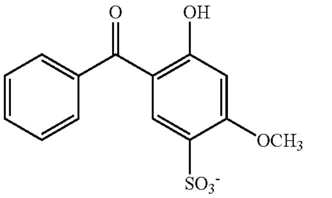
(N-8)
$ClO_4^-$
(N-9)
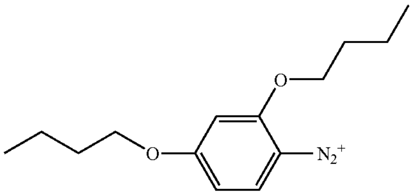
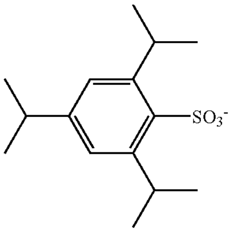
(N-10)
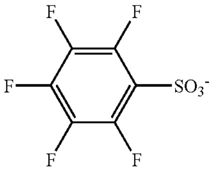
(N-11)
$PF_6^-$
(N-12)
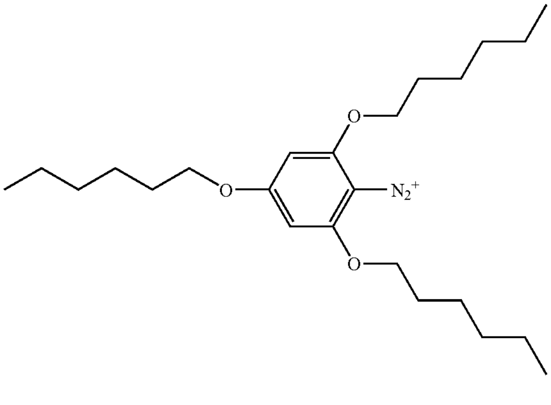
-continued
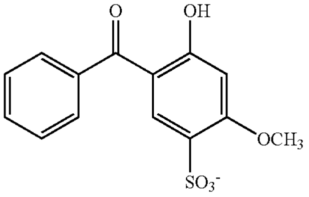
(N-13)
$ClO_4^-$
(N-14)
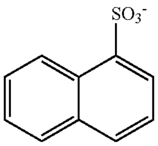
(I-1)
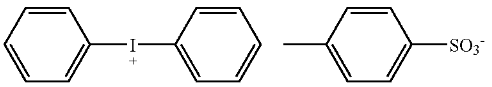
(I-2)
$PF_6^-$
(I-3)
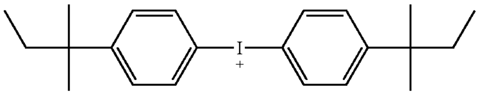
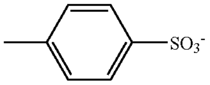
(I-4)
$ClO_4^-$
(I-5)
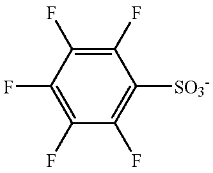
(I-6)
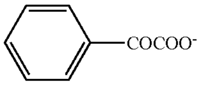
(I-7)
$CF_3SO_3^-$
(I-8)
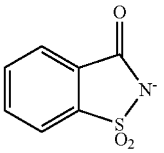
(I-9)
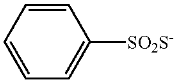
(I-10)
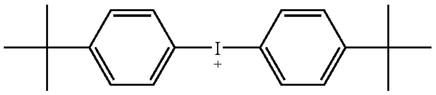
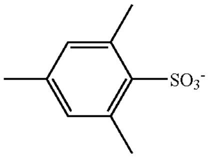

-continued
(I-11)
$ClO_4^-$
(I-12)
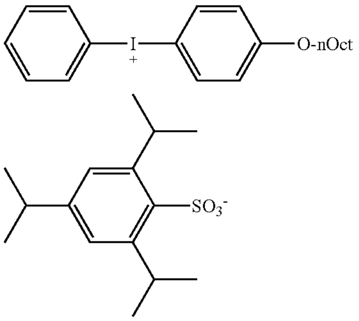
(I-13)
$CF_3COO^-$
(I-14)
$CF_3SO_3^-$
(I-15)
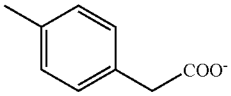
(I-16)
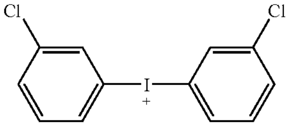
$BF_4^-$
(I-17)
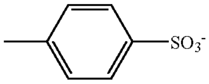
(I-18)
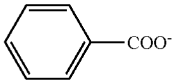
(S-1)
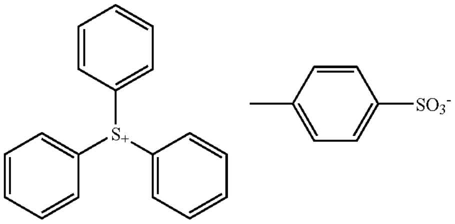
(S-2)
$PF_6^-$
(S-3)
$ClO_4^-$
(S-4)
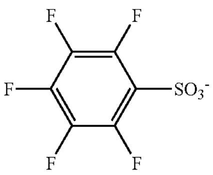
(S-5)
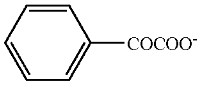
(S-6)
$CF_3SO_3^-$
-continued
(S-7)
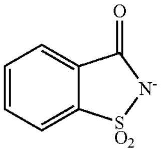
(S-8)
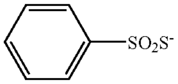
(S-9)
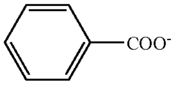
(S-10)
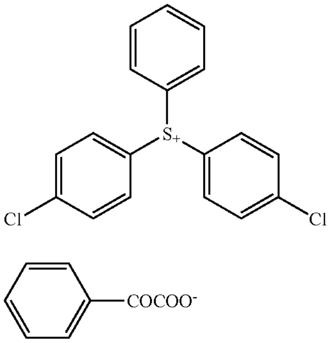
(S-11)
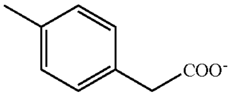
(S-12)
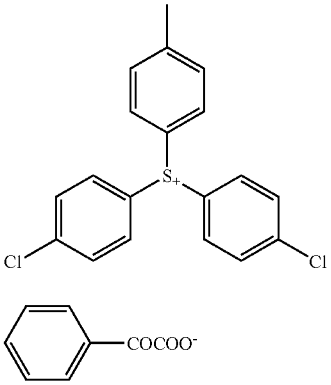
(S-13)
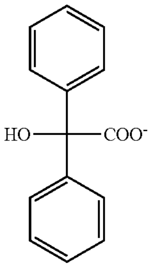
(S-14)
$BF_4^-$ -continued (S-15)

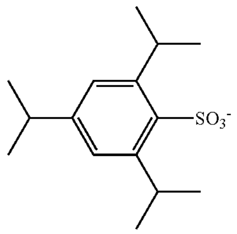

The radical polymerization initiator is preferably an onium salt represented by any one of formulae (RI-I) to (RI-III).

The radical initiator may be added at a ratio of 0.1 to 50 mass %, preferably from 0.5 to 30 mass %, more preferably from 1 to 20 mass %, based on all solid contents constituting the layer to which the radical initiator is added. Within this range, a printout image with good visibility can be obtained.

<Other Components of Image Recording Layer>

The radical polymerization-type image recording layer of the present invention may further contain, if desired, additives such as binder polymer, surfactant, colorant, polymerization inhibitor, higher fatty acid derivative, plasticizer, inorganic fine particle and low molecular hydrophilic compound. These components are described below.

<Binder Polymer>

The image recording layer of the present invention may contain a binder polymer. As for the binder polymer which can be used in the present invention, conventionally known binder polymers can be used without limitation and a linear organic polymer having film property is preferred. Examples of such a binder polymer include acrylic resin, polyvinyl acetal resin, polyurethane resin, polyurea resin, polyimide resin, polyamide resin, epoxy resin, methacrylic resin, polystyrene-based resin, novolak-type phenol-based resin, polyester resin, synthetic rubber and natural rubber.

The binder polymer preferably has crosslinking property so as to enhance the film strength in the image area. The crosslinking property may be imparted to the binder polymer by introducing a crosslinking functional group such as ethylenically unsaturated bond into the main or side chain of the polymer. The crosslinking functional group may be introduced by copolymerization.

Examples of the polymer having an ethylenically unsaturated bond in the main chain of the molecule include poly-1,4-butadiene and poly-1,4-isoprene.

Examples of the polymer having an ethylenically unsaturated bond in the side chain of the molecule include polymers which are a polymer of acrylic or methacrylic acid ester or amide and in which the ester or amide residue (R in —COOR or CONHR) has an ethylenically unsaturated bond.

Examples of the residue (R above) having an ethylenically unsaturated bond include $-(CH_2)_nCR^1=CR^2R^3$, $-(CH_2O)_nCH_2CR^1=CR^2R^3$, $-(CH_2CH_2O)_nCH_2CR^1=CR^2R^3$, $-(CH_2)_nNH-CO-O-CH_2CR^1=CR^2R^3$, $-(CH_2)_n-O-CO-CR^1=CR^2R^3$ and $-(CH_2CH_2O)_2-X$ (wherein $R^1$ to $R^3$ each represents a hydrogen atom, a halogen atom or an alkyl, aryl, alkoxy or aryloxy group having from 1 to 20 carbon atoms, $R^1$ and $R^2$ or $R^3$ may combine with each other to form a ring, n represents an integer of 1 to 10, and X represents a dicyclopentadienyl residue).

Specific examples of the ester residue include $-CH_2CH=CH_2$ (described in JP-B-7-21633), $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $-CH_2CH_2-NHCOO-CH_2CH=CH_2$ and $CH_2CH_2O-X$ (wherein X represents a dicyclopentadienyl residue).

Specific examples of the amide residue include $-CH_2CH=CH_2$, $-CH_2CH_2-Y$ (wherein Y represents a cyclohexene residue) and $-CH_2CH_2-OCO-CH=CH_2$.

In the binder polymer having a crosslinking property, for example, a free radical (a polymerization initiating radical or a radical grown in the process of polymerization of the polymerizable compound) is added to the crosslinking functional group to cause addition-polymerization between polymers directly or through a polymerization chain of the polymerizable compound, as a result, crosslinking is formed between polymer molecules and thereby curing is effected. Alternatively, an atom (for example, a hydrogen atom on the carbon atom adjacent to the functional crosslinking group) in the polymer is withdrawn by a free radical to produce a polymer radical and the polymer radicals combine with each other to form crosslinking between polymer molecules, thereby effecting curing.

The content of the crosslinking group (content of radical-polymerizable unsaturated double bond determined by iodine titration) in the binder polymer is preferably from 0.1 to 10.0 mmol, more preferably from 1.0 to 7.0 mmol, most preferably from 2.0 to 5.5 mmol, per g of the binder polymer. Within this range, good sensitivity and good storage stability can be obtained.

From the standpoint of enhancing the on-press developability, the binder polymer preferably has high solubility or dispersibility in the ink and/or fountain solution.

In order to enhance the solubility or dispersibility in the ink, the binder polymer is preferably lipophilic and in order to enhance the solubility or dispersibility in the fountain solution, the binder polymer is preferably hydrophilic. Therefore, use of a lipophilic binder polymer and a hydrophilic binder polymer in combination is also effective in the present invention.

Preferred examples of the hydrophilic binder polymer include those having a hydrophilic group such as hydroxy group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonic acid group and phosphoric acid group.

Specific examples thereof include gum arabic, casein, gelatin, starch derivatives, carboxymethyl cellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetates having a hydrolysis degree of 60 mol % or more, preferably 80 mol % or more, polyvinyl formal, polyvinyl butyral, polyvinylpyrrolidone, homopolymers and polymers of acrylamide, homopolymers and copolymers of methacrylamide, homopolymers and copolymers of N-methylolacrylamide, polyvinylpyrrolidone, alcohol-soluble nylons, and polyethers of 2,2-bis-(4-hydroxyphenyl)-propane with epichlorohydrin.

The binder polymer preferably has a weight average molecular weight of 5,000 or more, more preferably from 10,000 to 300,000. The number average molecular weight thereof is preferably 1,000 or more, more preferably from 2,000 to 250,000. The polydispersity (weight average molecular weight/number average molecular weight) is preferably from 1.1 to 10.

The binder polymer may be any of a random polymer, a block polymer and a graft polymer but is preferably a random polymer. The binder polymers may be used individually or in combination of two or more thereof.

The binder polymer can be synthesized by a conventionally known method. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide and water. These solvents are used individually or as a mixture of two or more thereof.

As for the radical polymerization initiator used in the synthesis of the binder polymer, known compounds such as azo-type initiator and peroxide initiator can be used.

The binder polymer content is preferably from 10 to 90 mass %, more preferably from 20 to 80 mass %, still more preferably from 30 to 70 mass %, based on the entire solid content of the image recording layer. Within this range, good strength of image area and good image-forming property can be obtained.

The polymerizable compound and the binder polymer are preferably used in amounts of giving a mass ratio of 1/9 to 7/3.

<Surfactant>

In the present invention, a surfactant is preferably used in the image recording layer so as to accelerate the on-press development at the initiation of printing and enhance the coated surface state. The surfactant includes a nonionic surfactant, an anionic surfactant, a cationic surfactant, an amphoteric surfactant, a fluorine-containing surfactant and the like. The surfactants may be used individually or in combination of two or more thereof.

The nonionic surfactant for use in the present invention is not particularly limited and a conventionally known nonionic surfactant can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, polyoxyethylene alkylamines, triethanolamine fatty acid esters, trialkylamine oxides, polyethylene glycol, and copolymers of polyethylene glycol and polypropylene glycol.

The anionic surfactant for use in the present invention is not particularly limited and a conventionally known anionic surfactant can be used. Examples thereof include fatty acid salts, abietates, hydroxyalkanesulfonates, alkanesulfonates, dialkylsulfosuccinic ester salts, linear alkylbenzenesulfonates, branched alkylbenzenesulfonates, alkylnaphthalenesulfonates, alkylphenoxypolyoxyethylenepropylsulfonates, polyoxyethylenealkylsulfophenyl ether salts, N-methyl-N-oleyltaurine sodium salts, monoamide disodium N-alkylsulfosuccinates, petroleum sulfonates, sulfated beef tallow oils, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified products of styrene/maleic anhydride copolymer, partially saponified products of olefin/maleic anhydride copolymer, and naphthalenesulfonate formalin condensates.

The cationic surfactant for use in the present invention is not particularly limited and a conventionally known cationic surfactant can be used. Examples thereof include alkylamine salts, quaternary ammonium salts, polyoxyethylenealkylamine salts and polyethylene polyamine derivatives.

The amphoteric surfactant for use in the present invention is not particularly limited and a conventionally known amphoteric surfactant can be used. Examples thereof include carboxybetaines, aminocarboxylic acids, sulfobetaines, aminosulfuric esters and imidazolines.

The term "polyoxyethylene" in the above-described surfactants can be instead read as "polyoxyalkylene" such as polyoxymethylene, polyoxypropylene and polyoxybutylene, and these surfactants can also be used in the present invention.

The surfactant is more preferably a fluorine-containing surfactant containing a perfluoroalkyl group within the molecule. This fluorine-containing surfactant includes an anionic type such as perfluoroalkylcarboxylate, perfluoroalkylsulfonate and perfluoroalkylphosphoric ester; an amphoteric type such as perfluoroalkylbetaine; a cationic type such as perfluoroalkyltrimethylammonium salt; and a nonionic type such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. In addition, fluorine-containing surfactants described in JP-A-62-170950, JP-A-62-226143 and JP-A-60-168144 may also be suitably used.

The surfactants can be used individually or in combination of two or more thereof.

The surfactant content is preferably from 0.001 to 10 mass %, more preferably from 0.01 to 7 mass %, based on the entire solid content of the image recording layer.

<Colorant>

In the present invention, various compounds may be further added, if desired, in addition to the above-described additives. For example, a dye having large absorption in the visible light region can be used as a colorant of the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247. Also, pigments such as phthalocyanine-based pigment, azo-based pigment, carbon black and titanium oxide may be suitably used.

The colorant is preferably added, because the image area and the non-image area after image formation can be clearly distinguished. The amount of the colorant added is preferably from 0.01 to 10 mass % based on the entire solid content of the image recording material.

<Polymerization Inhibitor>

In the image recording layer of the present invention, a small amount of a thermopolymerization inhibitor is preferably added so as to prevent the radical polymerizable compound from undergoing unnecessary thermopolymerization during the preparation or storage of the image recording layer.

Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The thermopolymerization inhibitor is preferably added in an amount of about 0.01 to about 5 mass % based on the entire solid content of the image recording layer.

<Higher Fatty Acid Derivative, Etc.>

In the image recording layer of the present invention, for example, a higher fatty acid derivative such as behenic acid or behenic acid amide may be added and localized on the surface of the image recording layer during drying after coating so as to prevent polymerization inhibition by oxygen. The amount of the higher fatty acid derivative added is preferably from about 0.1 to about 10 mass % based on the entire solid content of the image recording layer.

<Plasticizer>

The image recording layer of the present invention may contain a plasticizer so as to enhance the on-press developability.

Suitable examples of the plasticizer include phthalic acid esters such as dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalylethyl glycolate, methyl phthalylethyl glycolate, butyl phthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate.

The plasticizer content is preferably about 30 mass % or less based on the entire solid content of the image recording layer.

<Inorganic Fine Particle>

The image recording layer of the present invention may contain an inorganic fine particle so as to enhance the cured film strength in the image area as well as the on-press developability in the non-image area.

Suitable examples of the inorganic fine particle include silica, alumina, magnesium oxide, titanium oxide, magnesium carbonate, calcium alginate and a mixture thereof. Even if such an inorganic fine particle has no light-to-heat converting property, the inorganic fine particle can be used, for example, for strengthening the film or roughening the surface to enhance the interfacial adhesion.

The average particle diameter of the inorganic fine particle is preferably from 5 nm to 10 μm, more preferably from 0.5 to 3 μm. Within this range, the inorganic particles are stably dispersed in the image recording layer, so that the image recording layer can maintain sufficiently high film strength and the non-image area formed can ensure excellent hydrophilicity and less staining at printing.

Such an inorganic fine particle is easily available on the market as a colloidal silica dispersion or the like.

The inorganic fine particle content is preferably 20 mass % or less, more preferably 10 mass % or less, based on the entire solid content of the image recording layer.

<Low-Molecular Hydrophilic Compound>

The image recording layer of the present invention may contain a hydrophilic low-molecular compound so as to enhance the on-press developability. Examples of the hydrophilic low-molecular compound include, as the water-soluble organic compound, glycols and ether or ester derivatives thereof, such as ethylene glycol, diethylene glycol, triethylene glycol, propylene glycol, dipropylene glycol and tripropylene glycol; polyhydroxys such as glycerin and pentaerythritol; organic amines and salts thereof, such as triethanolamine, diethanolamine and monoethanolamine; organic sulfonic acids and salts thereof, such as toluenesulfonic acid and benzenesulfonic acid; organic phosphonic acids and salts thereof, such as phenylphosphonic acid; and organic carboxylic acids and salts thereof, such as tartaric acid, oxalic acid, citric acid, malic acid, lactic acid, gluconic acid and amino acids.

<Formation of Radical Polymerization-Type Image Recording Layer>

As for the method of incorporating the above-described image recording layer constituent components into the image recording layer, several embodiments can be used in the present invention. One is an embodiment of dissolving the constituent components in an appropriate solvent and coating the obtained solution as described, for example, in JP-A-2002-287334, and another is an embodiment of enclosing the image recording layer constituent components in a microcapsule and incorporating the microcapsule into the image recording layer (microcapsule-type image recording layer) as described, for example, in JP-A-2001-277740 and JP-A-2001-277742. Furthermore, in the microcapsule-type image recording layer, the constituent components may be incorporated also outside the microcapsule. In a preferred embodiment of the microcapsule-type image recording layer, hydrophobic constituent components are enclosed in a microcapsule and hydrophilic constituent components are incorporated outside the microcapsule.

In a more preferred embodiment for obtaining good printout image and good press life, the infrared absorbent, cyclic color-forming compound and dye stabilizer out of the constituent components of the image recording layer are microencapsulated, because the printout image-forming reaction system and the printed image-forming reaction system are separated and thereby respective reactions can be prevented from inhibiting each other.

For microencapsulating those constituent components of the image recording layer, conventionally known methods can be used. Examples of the method for producing a microcapsule include, but are not limited to, a method utilizing coacervation described in U.S. Pat. Nos. 2,800,457 and 2,800,458, a method utilizing interfacial polymerization described in U.S. Pat. No. 3,287,154, JP-B-38-19574 and JP-B-42-446, a method utilizing polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall material described in U.S. Pat. Nos. 4,001,140, 4,087,376 and 4,089,802, a method using a wall material such as melamine-formaldehyde resin or hydroxy cellulose described in U.S. Pat. No. 4,025,445, an in situ method utilizing monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074.

The microcapsule wall for use in the present invention preferably has a three-dimensionally crosslinked structure and has a property of swelling with a solvent. From this standpoint, the wall material of microcapsule is preferably polyurea, polyurethane, polyester, polycarbonate, polyamide or a mixture thereof, more preferably polyurea or polyurethane. Also, the above-described compound having a crosslinking functional group such as ethylenically unsaturated bond, which can be introduced into the binder polymer, may be introduced into the microcapsule wall.

The average particle diameter of the microcapsule is preferably from 0.01 to 3.0 μm, more preferably from 0.05 to 2.0 μm, still more preferably from 0.10 to 1.0 μm. Within this range, good resolution and good aging stability can be obtained.

The image recording layer of the present invention is formed by dispersing or dissolving the above-described necessary components in a solvent and coating the obtained coating solution. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxyethylacetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water. These solvents are used individually or in combination. The solid content concentration of the coating solution is preferably from 1 to 50 mass %.

The image recording layer of the present invention may also be formed by dispersing or dissolving the same or different components described above in the same or different solvents to prepare a plurality of coating solutions and repeating the coating and drying multiple times.

The amount (solid content) coated of the image recording layer obtained on the support after the coating and drying varies depending on the use but, in general, is preferably from 0.3 to 3.0 $g/m^2$. Within this range, good sensitivity and good film properties of the image recording layer can be obtained.

For the coating, various methods may be used and examples thereof include bar coater coating, rotary coating, spray coating, curtain coating, dip coating, air knife coating, blade coating and roll coating.

(B) Hydrophobization Precursor-Type Image-Forming Element

<Hydrophobization Precursor>

The hydrophobization precursor used in the present invention is a fine particle capable of converting the hydrophilic image recording layer into a hydrophobic layer when heat is applied. This fine particle is preferably at least one fine particle selected from a thermoplastic polymer fine particle and a thermoreactive polymer fine particle. The fine particle may also be a microcapsule enclosing a compound having a thermoreactive group.

Suitable examples of the thermoplastic polymer fine particle for use in the image recording layer of the present invention include the thermoplastic polymer fine particles described in *Research Disclosure,* No. 33303 (January, 1992), JP-A-9-123387, JP-A-9-131850, JP-A-9-171249, JP-A-9-171250 and European Patent 931,647. Specific examples of the polymer constituting the polymer fine particle include homopolymers or copolymers of a monomer such as ethylene, styrene, vinyl chloride, methyl acrylate, ethyl acrylate, methyl methacrylate, ethyl methacrylate, vinylidene chloride, acrylonitrile and vinyl carbazole, and a mixture thereof. Among these, preferred are polystyrene and polymethyl methacrylate.

The average particle diameter of the thermoplastic polymer fine particle for use in the present invention is preferably from 0.01 to 2.0 μm. Examples of the method for synthesizing such a thermoplastic polymer fine particle include an emulsion polymerization method, a suspension polymerization method, and a method of dissolving the compound in a water-insoluble organic solvent, mixing and emulsifying the obtained solution with an aqueous solution containing a dispersant, and solidifying the emulsification product into fine particles while dissipating the organic solvent under heat (dissolution dispersion method).

Examples of the thermoreactive polymer fine particle for use in the present invention includes a thermosetting polymer fine particle and a polymer fine particle having a thermoreactive group.

Examples of the thermosetting polymer include resins having a phenol skeleton, urea-based resins (for example, a resin obtained by resinifying urea or a urea derivative such as methoxymethylated urea with an aldehyde such as formaldehyde), melamine-based resins (for example, a resin obtained by resinifying melamine or a derivative thereof with an aldehyde such as formaldehyde), alkyd resin, unsaturated polyester resin, polyurethane resin and epoxy resin. Among these, preferred are resins having a phenol skeleton, melamine resin, urea resin and epoxy resin.

Suitable examples of the resin having a phenol skeleton include a phenol resin obtained by resinifying phenol, cresol or the like with an aldehyde such as formaldehyde, a hydroxystyrene resin and a methacrylamide or acrylamide polymer or copolymer or methacrylate or acrylate polymer or copolymer having a phenol skeleton, such as N-(p-hydroxyphenyl)methacrylamide and p-hydroxyphenyl methacrylate.

The average particle diameter of the thermosetting polymer fine particle for use in the present invention is preferably from 0.01 to 2.0 μm. Such a thermosetting polymer fine particle can be easily obtained by the dissolution dispersion method, but the thermosetting polymer may be formed into fine particles at the synthesis of polymer. However, the present invention is not limited to these methods.

The thermoreactive group of the polymer fine particle having a thermoreactive group for use in the present invention may be a functional group of undergoing any reaction as long as chemical bonding is formed, but suitable examples thereof include an ethylenically unsaturated group of undergoing a radical polymerization reaction (e.g., acryloyl group, methacryloyl group, vinyl group, allyl group), a cationic polymerizable group (e.g., vinyl group, vinyloxy group), a functional group having an isocyanate group or its block form, an epoxy group or a vinyloxy group of undergoing an addition reaction and an active hydrogen atom as the other party of the reaction (e.g., amino group, hydroxyl group, carboxyl group), a functional group having a carboxyl group of undergoing a condensation reaction and a hydroxyl or amino group as the other party of the reaction, and a functional group having an acid anhydride of undergoing a ring-opening addition reaction and an amino or hydroxyl group as the other party of the reaction.

Such a functional group may be introduced into the polymer fine particle at the polymerization or may be introduced by utilizing a polymer reaction after the polymerization.

In the case of introducing the functional group at the polymerization, a monomer having the above-described functional group is preferably emulsion polymerized or suspension polymerized. Specific examples of the monomer having the functional group include, but are not limited to, allyl methacrylate, allyl acrylate, vinyl methacrylate, vinyl acrylate, 2-(vinyloxy)ethyl methacrylate, p-vinyloxystyrene, p-{2-(vinyloxy)ethyl}styrene, glycidyl methacrylate, glycidyl acrylate, 2-isocyanatoethyl methacrylate or its block isocyanate with an alcohol or the like, 2-isocyanatoethyl acrylate or its block isocyanate with an alcohol or the like, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate and bifunctional methacrylate.

In the present invention, a copolymer of such a monomer and a monomer having no thermoreactive group and being copolymerizable with such a monomer may also be used. Examples of the copolymerization monomer having no thermoreactive group include styrene, alkyl acrylate, alkyl methacrylate, acrylonitrile and vinyl acetate, but as long as it is a monomer having no thermoreactive group, the monomer is not limited thereto.

Examples of the polymer reaction used in the case of introducing the thermoreactive group after the polymerization include the polymer reaction described in International Publication WO96/34316, pamphlet.

Among these polymer fine particles having a thermoreactive group, preferred are those of undergoing coalescence of polymer fine particles with each other under heat, more preferred are those having a hydrophilic surface and dispersible in water. The film formed by coating only the polymer fine particle and drying it at a temperature lower than the coagulation temperature preferably has a contact angle (aerial water droplet) lower than the contact angle (aerial water droplet) of a film formed by drying the polymer fine particle at a temperature higher than the coagulation temperature. The polymer fine particle surface can be made hydrophilic as above by causing a hydrophilic polymer (e.g., polyvinyl alcohol, polyethylene glycol) or oligomer or a hydrophilic low-molecular compound to adsorb the polymer fine particle surface, but the method for surface-hydrophilization is not limited thereto.

The coagulation temperature of the polymer fine particle having a thermoreactive group is preferably 70° C. or more and in view of aging stability, more preferably 100° C. or more. The average particle diameter of the polymer fine particle is preferably from 0.01 to 2.0 μm, more preferably from 0.05 to 2.0 μm, and most preferably from 0.1 to 1.0 μm. Within this range, good resolution and good aging stability can be obtained.

As for the thermoreactive group in the microcapsule enclosing a compound having a thermoreactive group for use in the present invention, suitable examples thereof are the same as those described above for the thermoreactive group used in the polymer fine particle having a thermoreactive group. The compound having a thermoreactive group is described below.

Suitable examples of the compound having a radical polymerizable unsaturated group include the same compounds as those described above for the radical polymerization-type microcapsule.

Suitable examples of the compound having a vinyloxy group for use in the present invention include compounds described in JP-A-2002-029162. Specific examples thereof include, but are not limited to, tetramethylene glycol divinyl ether, trimethylolpropane trivinyl ether, tetraethylene glycol divinyl ether, pentaerythritol divinyl ether, pentaerythritol trivinyl ether, pentaerythritol tetravinyl ether, 1,4-bis{2-(vinyloxy)ethyloxy}benzene, 1,2-bis{2-(vinyloxy)ethyloxy}benzene, 1,3-bis{2-(vinyloxy)ethyloxy}benzene, 1,3,5-tris{2-(vinyloxy)ethyloxy}benzene, 4,4'-bis{2-(vinyloxy)ethyloxy}biphenyl, 4,4'-bis{2-(vinyloxy)ethyloxy}diphenylether, 4,4'-bis{2-(vinyloxy)ethyloxy}diphenylmethane, 1,4-bis{2-(vinyloxy)ethyloxy}naphthalene, 2,5-bis{2-(vinyloxy)ethyloxy}furan, 2,5-bis{2-(vinyloxy)ethyloxy}thiophene, 2,5-bis{2-(vinyloxy)ethyloxy}imidazole, 2,2-bis[4-{2-(vinyloxy)ethyloxy}phenyl]propane {bis(vinyloxyethyl)ether of bisphenol A}, 2,2-bis{4-(vinyloxymethyloxy)phenyl}propane and 2,2-bis{4-(vinyloxy)phenyl}propane.

The compound having an epoxy group suitably used in the present invention is preferably a compound having two or more epoxy groups, and examples thereof include glycidyl ether compounds or prepolymers thereof, which are obtained by a reaction of a polyhydric alcohol or a polyvalent phenol with epichlorohydrin, and polymers or copolymers of glycidyl acrylate or glycidyl methacrylate.

Specific examples thereof include a propylene glycol diglycidyl ether, a tripropylene glycol diglycidyl ether, a polypropylene glycol diglycidyl ether, a neopentyl glycol diglycidyl ether, a trimethylolpropane triglycidyl ether, a diglycidyl ether of hydrogenated bisphenol A, a hydroquinone diglycidyl ether, a resorcinol diglycidyl ether, a diglycidyl ether or epichlorohydrin polyadduct of bisphenol A, a diglycidyl ether or epichlorohydrin polyadduct of bisphenol F, a diglycidyl ether or epichlorohydrin polyadduct of halogenated bisphenol A, a diglycidyl ether or epichlorohydrin polyadduct of biphenyl-type bisphenol, a glycidyl etherified novolak resin, a methyl methacrylate/glycidyl methacrylate copolymer, and an ethyl methacrylate/glycidyl methacrylate copolymer.

Examples of the commercially available product of this compound include Epikote 1001 (molecular weight: about 900, epoxy equivalent: from 450 to 500), Epikote 1002 (molecular weight: about 1,600, epoxy equivalent: from 600 to 700), Epikote 1004 (molecular weight: about 1,060, epoxy equivalent: from 875 to 975), Epikote 1007 (molecular weight: about 2,900, epoxy equivalent: 2,000), Epikote 1009 (molecular weight: about 3,750, epoxy equivalent: 3,000), Epikote 1010 (molecular weight: about 5,500, epoxy equivalent: 4,000), Epikote 1100L (epoxy equivalent: 4,000), Epikote YX31575 (epoxy equivalent: 1,200) (all produced by Japan Epoxy Resin), Sumiepoxy ESCN-195XHN, ESCN-195XL and ESCN-195XF (all produced by Sumitomo Chemical Co., Ltd.).

Suitable examples of the isocyanate compound for use in the present invention include tolylene diisocyanate, diphenylmethane diisocyanate, polymethylene polyphenyl polyisocyanate, xylylene diisocyanate, naphthalene diisocyanate, cyclohexanephenylene diisocyanate, isophorone diisocyanate, hexamethylene diisocyanate, cyclohexyl diisocyanate, and compounds resulting from blocking these isocyanate compounds with an alcohol or an amine.

Suitable examples of the amine compound for use in the present invention include ethylenediamine, diethylenetriamine, triethylenetetramine, hexamethylenediamine, propylenediamine and polyethyleneimine.

Suitable examples of the compound having a hydroxy group for use in the present invention include compounds having a terminal methylol group, polyhydric alcohols such as pentaerythritol, and bisphenols polyphenols.

Suitable examples of the compound having a carboxy group for use in the present invention include aromatic polyvalent carboxylic acids such as pyromellitic acid, trimellitic acid and phthalic acid, and aliphatic polyvalent carboxylic acids such as adipic acid. Suitable examples of the acid anhydride for use in the present invention include pyromellitic anhydride and benzophenonetetracarboxylic anhydride.

The microencapsulation of the compound having a thermoreactive group can be performed by the known method described above in regard of the radical polymerization type.

<Other Components of Image Recording Layer>

The image recording layer of the present invention may contain a hydrophilic resin so as to enhance the on-press developability and the film strength of the image recording layer itself. The hydrophilic resin is preferably a resin having a hydrophilic group such as hydroxyl group, amino group, carboxyl group, phosphoric acid group, sulfonic acid group and amido group. The hydrophilic resin is crosslinked by reacting with the thermoreactive group of the hydrophobization precursor, as a result, the image strength and the impression capacity are increased. Therefore, the hydrophilic resin preferably has a group which reacts with the thermoreactive group. For example, in the case where the hydrophobization precursor has a vinyloxy group or an epoxy group, hydrophilic resins having a hydroxyl group, a carboxyl group, a phosphoric acid group, a sulfonic acid group or the like are preferred. Among these, hydrophilic resins having a hydroxyl group or a carboxyl group are more preferred.

Specific examples of the hydrophilic resin include gum arabic, casein, gelatin, starch derivatives, soybean glue, hydroxypropyl cellulose, methyl cellulose, carboxymethyl cellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of at least 60 mol %, preferably at least 80 mol %, polyvinyl formal, polyvinylpyrrolidone, homopolymers and copolymers of acrylamide, homopolymers and copolymers of methacrylamide, homopolymers and copolymers of N-methylolacrylamide, homopolymers and copolymers of 2-acrylamide-2-methyl-1-propanesulfonic acid, and homopolymers and copolymers of 2-methacryloyloxyethylphosphonic acid.

The amount of the hydrophilic resin added to the image recording layer is preferably 20 mass % or less, more preferably 10 mass % or less.

The hydrophilic resin may be crosslinked to such a degree that the unexposed area can be on-press developed on a printing press. Examples of the crosslinking agent include aldehydes such as glyoxal, melamine formaldehyde resin and urea formaldehyde resin; methylol compounds such as N-methylolurea, N-methylolmelamine and methylolated polyamide resin; active vinyl compounds such as divinylsulfone and bis(β-hydroxyethylsulfonic acid); epoxy compounds such as epichlorohydrin, polyethylene glycol diglycidyl ether, polyamide, polyamine, epichlorohydrin adduct and polyamide epichlorohydrin resin; ester compounds such as monochloroacetic acid ester and thioglycolic acid ester; polycarboxylic acids such as polyacrylic acid and methyl vinyl ether/maleic acid copolymer; inorganic crosslinking agents such as boric acid, titanyl sulfate, Cu, Al, Sn, V and Cr salt; and modified polyamide polyimide resins. In combination therewith, a crosslinking catalyst such as ammonium chloride, silane coupling agent and titanate coupling agent can be used.

The image recording layer of the present invention may contain a reaction accelerator of initiating or accelerating the reaction of the thermoreactive group. Suitable examples of the reaction accelerator include the radical initiators described above.

The reaction accelerators can also be used in combination of two or more thereof. The addition of the reaction accelerator to the image recording layer may be direct addition to the coating solution for the image recording layer, or addition in the form of being contained in the polymer fine particle. The content of the reaction accelerator in the image recording layer is preferably from 0.01 to 20 mass %, more preferably from 0.1 to 10 mass %, based on the entire solid content of the image recording layer. Within this range, good reaction initiating or accelerating effect can be obtained without impairing the on-press developability.

In the case of the hydrophobization precursor-type image recording layer of the present invention, a polyfunctional monomer may be added to the image recording layer matrix so as to more enhance the impression capacity. Examples of the polyfunctional monomer include those described above as the polymerizable compound. Among these monomers, preferred are trimethylolpropane triacrylate and pentaerythritol triacrylate.

In addition, the hydrophobization precursor-type image recording layer of the present invention may contain, if desired, additives such as surfactant, colorant, polymerization inhibitor, higher fatty acid derivative, plasticizer, inorganic fine particle and low-molecular hydrophilic compound which are described above in <Other Components of Image recording Layer> of the polymerization-type image recording layer.

<Formation of Hydrophobization Precursor-Type Image recording Layer>

The hydrophobization precursor-type image recording layer of the present invention is formed, similarly to the above-described radical polymerization-type image recording layer, by dispersing or dissolving necessary components in a solvent to prepare a coating solution, and coating and drying it on a support.

The amount (solid content) coated of the image recording layer obtained on the support after coating and drying varies depending on use but in general, is preferably from 0.5 to 5.0 $g/m^2$.

When the hydrophobization precursor-type image recording layer is used, an on-press developable lithographic printing plate precursor can be produced.

On the other hand, when the hydrophobization precursor-type image recording layer is formed as a "hydrophilic layer having a crosslinked structure" ensuring satisfactory impression capacity even when unexposed, the lithographic printing plate precursor of the present invention can be applied to the non-processing (non-development) type lithographic printing plate precursor.

In a preferred embodiment, the hydrophilic layer having a crosslinked structure contains at least either one of a hydrophilic resin having formed therein a crosslinked structure and an inorganic hydrophilic binding resin formed by so-gel conversion. Of these, the hydrophilic resin is first described below. The addition of the hydrophilic resin is advantageous in that the affinity for hydrophilic components in the emulsion ink is enhanced and the film strength of the image recording layer itself is elevated. Preferred examples of the hydrophilic resin include those having a hydrophilic group such as hydroxyl, carboxyl, hydroxyethyl, hydroxypropyl, amino, aminoethyl, aminopropyl and carboxymethyl.

Specific examples of the hydrophilic resin include gum arabic, casein, gelatin, starch derivatives, carboxymethyl cellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetates having a hydrolysis degree of at least 60 mol %, preferably at least 80 mol %, polyvinyl formal, polyvinyl butyral, polyvinylpyrrolidone, homopolymers and copolymers of acrylamide, homopolymers and polymers of methacrylamide, and homopolymers and copolymers of N-methylolacrylamide.

In the case of using this hydrophilic resin for the image recording layer of the present invention, the hydrophilic resin may be used by crosslinking it. As for the crosslinking agent used for forming the crosslinked structure, those described above can be used.

In another preferred embodiment of the non-processing (non-development) type image recording layer, the image recording layer contains an inorganic hydrophilic binding resin formed by so-gel conversion. The sol-gel conversion-type binding resin is suitably a polymer body where the bonding groups from polyvalent elements form a network structure via oxygen atoms, that is, a three-dimensional crosslinked structure, and at the same time, polyvalent metals also have non-bonded hydroxyl groups and alkoxyl groups which are present randomly to form a resinous structure. In a stage where many alkoxy groups and hydroxyl groups are present, the resin is in a sol state. As the dehydration condensation proceeds, the network resin structure is stiffened. The polyvalent bonding element of the compound having a hydroxyl group and an alkoxy group and undergoing sol-gel conversion is aluminum, silicon, titanium, zirconium or the like. These elements all can be used in the present invention. In particular, a sol-gel conversion system using silicon is preferred, and a system containing a silane compound capable of undergoing sol-gel conversion and having at least one silanol group is more preferred. The sol-gel conversion system using silicon is described below, but the sol-gel conversion system using aluminum, titanium or zirconium can be effected by replacing silicon described below with respective elements.

The sol-gel conversion-type binding resin is preferably a resin having a siloxane bond and a silanol group. When a coating solution as a sol system containing a compound having at least one silanol group is used, gelling occurs with the progress of condensation of the silanol group during coating and drying, and a siloxane skeleton structure is formed. Through this process, the binding resin is incorporated into the image recording layer of the present invention.

In the image recording layer containing the sol-gel conversion-type binding resin, the above-described hydrophilic resin and crosslinking agent may be used in combination with the binding resin for the purpose of improving physical properties such as film strength and flexibility of film, or enhancing the coatability.

The siloxane resin forming a gel structure is represented by the following formula (V), and the silane compound having at least one silanol group is represented by the following formula (VI). The substance system added to the image recording layer is not necessarily the silane compound represented by formula (VI) alone but in general, may be an oligomer resulting from partial condensation of the silane compound or a mixture of the silane compound of formula (VI) and the oligomer.

Formula (V):

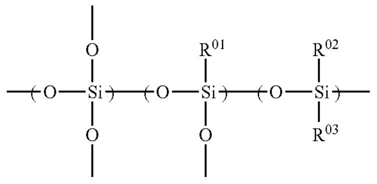

The siloxane resin represented by formula (V) is formed by sol-gel conversion from a liquid dispersion containing at least one silane compound represented by formula (VI). In formula (V), at least one of $R^{01}$ to $R^{03}$ represents a hydroxyl group, and the remaining represents an organic residue selected from $R^0$ and Y in formula (VI).

Formula (VI): $(R^0)_nSi(Y)_{4-n}$ wherein $R^0$ represents a hydroxyl group, a hydrocarbon group or a heterocyclic group, Y represents a hydrogen atom, a halogen atom, —$OR^1$, —$OCOR^2$ or —$N(R^3)(R^4)$, $R^1$ and $R^2$ each represents a hydrocarbon group, $R^3$ and $R^4$ may be the same or different and each represents a hydrocarbon group or a hydrogen atom, and n represents 0, 1, 2 or 3.

The hydrocarbon group or heterocyclic group of $R^0$ represents, for example, a linear or branched alkyl group having from 1 to 12 carbon atoms, which may be substituted (examples of the alkyl group include a methyl group, an ethyl group, a propyl group, a butyl group, a pentyl group, a hexyl group, a heptyl group, an octyl group, a nonyl group, a decyl group, a dodecyl group; examples of the group substituted to these groups include a halogen atom (e.g., chlorine, fluorine, bromine), a hydroxyl group, a thiol group, a carboxyl group, a sulfo group, a cyano group, an epoxy group, an —OR' group (R' represents a methyl group, an ethyl group, a propyl group, a butyl group, a heptyl group, a hexyl group, an octyl group, a decyl group, a propenyl group, a butenyl group, a hexenyl group, an octenyl group, a 2-hydroxyethyl group, a 3-chloropropyl group, a 2-cyanoethyl group, an N,N-dimethylaminoethyl group, a 2-bromoethyl group, a 2-(2-methoxyethyl)oxyethyl group, a 2-methoxycarbonylethyl group, a 3-carboxyethyl group, a 3-carboxypropyl group or a benzyl group), a —OCOR" group (R" has the same meaning as R'), a —COOR" group, a —COR" group, a —N(R''')(R''') group (R''' represents a hydrogen atom or has the same meaning as R', and R'''s may be the same or different), a —NHCONHR" group, a —NHCOOR" group, an —Si(R")$_3$ group and a —CONHR" group; a plurality of these substituents may be substituted in the alkyl group), a linear or branched alkenyl group having from 2 to 12 carbon atoms, which may be substituted (examples of the alkenyl group include a vinyl group, a propenyl group, a butenyl group, a pentenyl group, a hexenyl group, an octenyl group, a decenyl group and a dodecenyl group; examples of the group substituted to these groups are the same as those of the group substituted to the alkyl group), an aralkyl group having from 7 to 14 carbon atoms, which may be substituted (examples of the aralkyl group include a benzyl group, a phenethyl group, a 3-phenylpropyl group, a naphthylmethyl group and a 2-naphthylethyl group; examples of the group substituted to these groups are the same as those of the group substituted to the alkyl group; a plurality of these substituents may be substituted), an alicyclic group having from 5 to 10 carbon atoms, which may be substituted (examples of the alicyclic group include a cyclopentyl group, a cyclohexyl group, a 2-cyclohexylethyl group, a norbornyl group and an adamantyl group; examples of the group substituted to these groups are the same as those of the group substituted to the alkyl group; a plurality of these substituents may be substituted), an aryl group having from 6 to 12 carbon atoms, which may be substituted (examples of the aryl group include a phenyl group and a naphthyl group; examples of the substituent are the same as those of those of the group substituted to the alkyl group; a plurality of these substituents may be substituted), or a heterocyclic group containing at least one atom selected from a nitrogen atom, an oxygen atom and a sulfur atom, which may be condensed (examples of the heterocyclic group include a pyran ring, a furan ring, a thiophene ring, a morpholine ring, a pyrrole ring, a thiazole ring, an oxazole ring, a pyridine ring, a piperidine ring, a pyrrolidone ring, a benzothiazole ring, a benzoxazole ring, a quinoline ring and a tetrahydrofuran ring; these rings each may have a substituent and examples of the substituent are the same as those of the group substituted to the alkyl group; a plurality of substituents may be substituted).

The substituent in the —OR$^1$ group, —OCOR$^2$ group or —N(R$^3$)(R$^4$) group for Y of formula (VI) represents, for example, the following substituent. In the —OR$^1$ group, R$^1$ represents an aliphatic group having from 1 to 10 carbon atoms, which may be substituted [examples of the aliphatic group include a methyl group, an ethyl group, a propyl group, a butyl group, a heptyl group, a hexyl group, a pentyl group, an octyl group, a nonyl group, a decyl group, a propenyl group, a butenyl group, a heptenyl group, a hexenyl group, an octenyl group, a decenyl group, a 2-hydroxyethyl group, a 2-hydroxypropyl group, a 2-methoxyethyl group, a 2-(2-methoxyethyl)oxyethyl group, a 2-(N,N-diethylamino)ethyl group, a 2-methoxypropyl group, a 2-cyanoethyl group, a 3-methyloxypropyl group, a 2-chloroethyl group, a cyclohexyl group, a cyclopentyl group, a cyclooctyl group, a chlorocyclohexyl group, a methoxycyclohexyl group, a benzyl group, a phenethyl group, a dimethoxybenzyl group, a methylbenzyl group and a bromobenzyl group].

In the —OCOR$^2$ group, R$^2$ represents an aliphatic group having the same meaning as R$^1$ or an aromatic group having from 6 to 12 carbon atoms, which may be substituted (examples of the aromatic group are the same as those described for the aryl group of R). In the —N(R$^3$)(R$^4$) group, R$^3$ and R$^4$ may be the same or different and each represents a hydrogen atom or an aliphatic group having from 1 to 10 carbon atoms, which may be substituted (examples of the aliphatic group are the same as those described for R$^1$ of the —OR$^1$ group). More preferably, the total number of carbon atoms in R$^3$ and R$^4$ is 16 or less. Specific examples of the silane compound represented by formula (VI) include, but are not limited to, the following compounds: tetrachlorosilane, tetramethoxysilane, tetraethoxysilane, tetraisopropoxysilane, tetra-n-propylsilane, methyltrichlorosilane, methyltrimethoxysilane, methyltriethoxysilane, ethyltrichlorosilane, ethyltrimethoxysilane, ethyltriethoxysilane, n-propyltrichlorosilane, n-propyltrimethoxysilane, n-hexyltrimethoxysilane, n-decyltrimethoxysilane, phenyltrichlorosilane, phenyltrimethoxysilane, dimethoxyditriethoxysilane, dimethyldichlorosilane, dimethyldimethoxysilane, diphenyldimethoxysilane, phenylmethyldimethoxysilane, triethoxyhydrosilane, trimethoxyhydrosilane, vinyltrichlorosilane, vinyltrimethoxysilane, trifluoropropyltrimethoxysilane, γ-glycidoxypropylmethyldimethoxysilane, γ-glycidoxypropylmethyldiethoxysilane, γ-glycidoxypropyltriethoxysilane, γ-methacryloxypropyltrimethoxysilane, γ-aminopropylmethyldimethoxysilane, γ-aminopropyltriethoxysilane, γ-mercaptopropylmethyldimethoxysilane, γ-mercaptopropyltrimethoxysilane, γ-mercaptopropyltriethoxysilane and β-(3,4-epoxycyclohexyl)ethyltrimethoxysilane.

In the image recording layer of the present invention, in combination with the silane compound of formula (VI), a metal compound capable of bonding to the resin on sol-gel conversion and forming a film, such as Ti, Zn, Sn, Zr and Al, can be used. Examples of the metal compound used here include $Ti(OR")_4$, $TiCl_4$, $Zn(OR")_2$, $Zn(CH_3COCHCOCH_3)_2$, $Sn(OR")_4$, $Sn(CH_3COCHCOCH_3)_4$, $Sn(OCOR")_4$, $SnCl_4$, $Zr(OR")_4$, $Zr(CH_3COCHCOCH_3)_4$, $(NH_4)_2ZrO(CO_3)_2$, $Al(OR")_3$ and $Al(CH_3COCHCOCH_3)_3$, wherein R" represents a methyl group, an ethyl group, a propyl group, a butyl group, a pentyl group or a hexyl group.

In order to accelerate the hydrolysis and polycondensation reaction of the compound represented by formula (VI) and the metal compound used together, an acidic catalyst or a basic catalyst is preferably used in combination. For the catalyst, an acidic or basic compound may be used as-is or may be used after dissolving it in water or a solvent such as alcohol (hereinafter referred to as an acidic catalyst or a basic catalyst). At this time, the concentration is not particularly limited but when the concentration is high, the hydrolysis and polycondensation reaction tend to proceed at a high rate.

However, if a basic catalyst in a high concentration is used, a precipitate may be produced in the sol solution. Therefore, the concentration of the basic catalyst is preferably 1N (concentration calculated in terms of an aqueous solution) or less.

Specific examples of the acidic catalyst include hydrogen halides such as hydrochloric acid, carboxylic acids such as nitric acid, sulfuric acid, sulfurous acid, hydrogen sulfide, perchloric acid, hydrogen peroxide, carbonic acid, formic acid and acetic acid, and sulfonic acids such as benzenesulfonic acid, and specific examples of the basic catalyst include ammoniacal bases such as aqueous ammonia, and amines such as ethylamine and aniline. However, the present invention is not limited thereto.

The image recording layer produced by using the above-described sol-gel method is particularly preferred as the constitution of the image recording layer according to the present invention. The sol-gel method is described in detail, for example, in Sumio Sakka, *Sol-Gel Ho no Kagaku* (*Science of Sol-Gel Method*), Agne Shofu-Sha (1988), and Seki Hirashima, *Saishin Sol-Gel Ho niyoru Kinosei Usumaku Sakusei Gijutsu* (*Production Technique of Functional Thin Film by the Latest Sol-Gel Method*), Sogo Gijutsu Center (1992).

The amount added of the hydrophilic resin in the image recording layer having a crosslinked structure is preferably from 5 to 70 mass %, more preferably from 5 to 50 mass %, based on the solid content of the image recording layer.

[Support]

The support for use in the lithographic printing plate precursor of the present invention is not particularly limited and may be sufficient if it is a dimensionally stable plate-like material. Examples thereof include paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated with or having vapor-deposited thereon the above-described metal. Among these supports, polyester film and aluminum plate are preferred, and aluminum plate is more preferred because this is dimensionally stable and relatively inexpensive.

The aluminum plate is a pure aluminum plate, an alloy plate mainly comprising aluminum and containing trace heteroelements, or an aluminum or aluminum alloy thin film laminated with a plastic. Examples of the heteroelement contained in the aluminum alloy include silicon, iron, manganese, copper, magnesium, chromium, zinc, bismuth, nickel and titanium. The heteroelement content in the alloy is preferably 10 mass % or less. In the present invention, a pure aluminum plate is preferred, but completely pure aluminum is difficult to produce in view of refining technique and therefore, an aluminum plate containing trace heteroelements may be used. The composition of the aluminum plate is not particularly specified, and conventionally known and commonly employed materials can be appropriately used.

The thickness of the support is preferably from 0.1 to 0.6 mm, more preferably from 0.15 to 0.4 mm, still more preferably from 0.2 to 0.3 mm.

In advance of using the aluminum plate, the aluminum plate is preferably subjected to a surface treatment such as surface roughening and formation of hydrophilic film. This surface treatment facilitates enhancing hydrophilicity and ensuring adhesion between the image recording layer and the support. Before surface-roughening the aluminum plate, a degreasing treatment for removing the rolling oil on the surface is performed, if desired, by using a surfactant, an organic solvent, an alkaline aqueous solution or the like.

<Surface-Roughening Treatment>

The surface-roughening treatment of the aluminum plate surface is performed by various methods and examples thereof include a mechanical surface-roughening treatment, an electrochemical surface-roughening treatment (surface-roughening treatment of electrochemically dissolving the surface) and a chemical surface-roughening treatment (a surface-roughening treatment of chemically and selectively dissolving the surface).

The mechanical surface-roughening treatment may be performed by using a known method such as ball polishing, brush polishing, blast polishing and buff polishing.

The method for the electrochemical surface-roughening treatment includes, for example, a method of passing an alternating or direct current in an electrolytic solution containing an acid such as hydrochloric acid or nitric acid. Also, a method using a mixed acid described in JP-A-54-63902 may be used.

<Formation of Hydrophilic Film>

The aluminum plate subjected to the surface-roughening treatment and, if desired, to other treatments is then subjected to a treatment for providing a hydrophilic film having a low thermal conductivity. The thermal conductivity in the thickness direction of the hydrophilic film is 0.05 W/mK or more, preferably 0.08 W/mK or more, and 0.5 W/mK or less, preferably 0.3 W/mK or less, more preferably 0.2 W/mK or less. When the thermal conductivity in the film thickness direction is from 0.05 to 0.5 W/mK, the heat generated in the photosensitive-thermosensitive layer upon exposure with laser light can be prevented from diffusing into the support. As a result, in the case of using the lithographic printing plate precursor of the present invention as an on-press development type or non-processing type, the heat generated upon laser exposure can be effectively utilized to allow for elevation of sensitivity, so that image formation and printout image formation can be satisfactorily attained.

The thermal conductivity in the thickness direction of the hydrophilic film as defined in the present invention is described below. As for the method of measuring the thermal conductivity of a thin film, various methods have been heretofore reported. In 1986, ONO et al. reported a thermal conductivity in the plane direction of a thin film determined by using a thermograph. Also, there have been reported attempts to apply an AC heating method to the measurement of thermal properties of a thin film. The history of the AC heating method can be traced even to the report of 1863. In recent years, heating methods using a laser have been developed and various measuring methods utilizing combination with Fourier conversion have been proposed. In practice, devices using a laser angstrom method are commercially available. These methods all are to determine the thermal conductivity in the plane direction (in-plane direction) of a thin film.

However, in considering the thermal conduction of a thin film, an important factor is rather the thermal diffusion in the depth direction.

As reported in various papers, the thermal conductivity is not isotropic and particularly, in cases as in the present invention, it is very important to directly measure the thermal conductivity in the film thickness direction. From such a standpoint, a method using a thermal comparator has been reported in the paper by Lambropoulos et al. (*J. Appl. Phys.,* 66 (9) (November, 1989)) and the paper by Henager et al. (*APPLIED OPTICS,* Vol. 32, No. 1 (Jan. 1, 1993)) with an attempt to measure the thermal properties in the thickness direction of a thin film. Furthermore, a method of measuring the thermal diffusivity of a polymer thin film by temperature wave thermal analysis to which Fourier analysis is applied has been recently reported by Hashimoto et al. (*Netsu Sokutei* (*Heat Measurement*), 27 (3) (2000)).

The thermal conductivity in the thickness direction of a hydrophilic film as defined in the present invention is measured by a method using the above-described thermal comparator. This method is specifically described below, but its fundamental principles are described in detail in the paper by Lambropoulos et al. supra and the paper by Henager et al. supra. In the present invention, the thermal conductivity is measured by the method described in JP-A-2003-103951 using the thermal comparator shown in FIG. 3 of the same patent publication.

The relationship between each temperature and thermal conductivity of film can be expressed by the following formula (1):

$$\frac{(T_r - T_b)}{(T_r - T_t)} = \left(\frac{4K_1 r_1}{K_{tf} A_3}\right)t + \left(1 + \left(\frac{4K_1 r_1}{K_2 A_2}\right)t_2 + \left(\frac{K_1 r_1}{K_4 r_1}\right)\right) \quad (1)$$

wherein $T_t$: temperature at distal end of tip, $T_b$: heat sink temperature, $T_r$: temperature of reservoir, $K_{tf}$: thermal conductivity of film, $K_1$: thermal conductivity of reservoir, $K_2$: thermal conductivity of tip (in the case of oxygen-free copper, 400 W/mK), $K_4$: thermal conductivity of metal substrate (when film is not provided thereon), $r_1$: radius of curvature at distal end of tip, $A_2$: contact area between reservoir and tip, $A_3$: contact area between tip and film, t: film thickness, and $t_2$: contact thickness (about 0).

By changing the film thickness (t) and measuring and plotting respective temperatures ($T_t$, $T_b$ and $T_r$), the gradient of formula (1) is determined, whereby the thermal conductivity of film ($K_{tf}$) can be determined. That is, as apparent from formula (1), this gradient is a value determined by the thermal conductivity of reservoir ($K_1$), the radius of curvature at distal end of tip ($r_1$), the thermal conductivity of film ($K_{tf}$) and the contact area between tip and film ($A_3$) and since $K_1$, $r_1$ and $A_3$ are known values, the value of $K_{tf}$ can be determined from the gradient.

The present inventors determined the thermal conductivity of a hydrophilic film (anodic oxide film $Al_2O_3$) provided on an aluminum substrate by using the above-described measuring method. The temperatures were measured by changing the film thickness, as a result, the thermal conductivity of $Al_2O_3$ determined from the gradient of graph was 0.69 W/mK. This reveals good agreement with the results in the paper by Lambropoulos et al. supra. This result also reveals that the thermal physical values of a thin film differ from the thermal physical values of a bulk (the thermal conductivity of bulk $Al_2O_3$ is 28 W/mK).

When the above-described method is used for the measurement of the thermal conductivity in the thickness direction of the hydrophilic film on the lithographic printing plate precursor of the present invention and when a tip with fine distal end is used and the pressing load is kept constant, non-fluctuated results can be obtained even on the surface roughened for use as a lithographic printing plate and therefore, this method is preferred. The thermal conductivity is preferably determined as an average value by measuring the thermal conductivity at different multiple points on a sample, for example, at 5 points.

The thickness of the hydrophilic film is, in view of printing press and less scratchability, preferably 0.1 μm or more, more preferably 0.3 μm or more, still more preferably 0.6 μm or more. Also, from the standpoint of production cost, since a large energy is necessary for providing a thick film, the film thickness is preferably 5 μm or less, more preferably 3 μm or less, still more preferably 2 μm or less.

On taking account of effect on heat insulation and in view of film strength and less staining at printing, the hydrophilic film of the present invention preferably has a density of 1,000 to 3,200 $kg/m^3$.

As for the method of measuring the density, for example, from the mass measured by Mason's method (anodic oxide film mass method by dissolution in a chromic acid/phosphoric acid mixed solution) and the film thickness determined by observing the cross section through SEM, the density can be calculated according to the following formula:

Density ($kg/m^3$)=(mass of hydrophilic film per unit area/film thickness)

The method for providing the hydrophilic film is not particularly limited and, for example, anodization, vapor deposition, CVD, sol-gel method, sputtering, ion plating or diffusion method can be appropriately used. Also, a method of coating a solution obtained by mixing hollow particles in the hydrophilic resin or sol-gel solution can be used.

Among these, a treatment of producing an oxide by anodization, that is, an anodization treatment, is most preferred. The anodization treatment can be performed by a method conventionally employed in this field. Specifically, when DC or AC is passed to an aluminum plate in an aqueous or nonaqueous solution comprising a sulfuric acid, a phosphoric acid, a chromic acid, an oxalic acid, a sulfamic acid, a benzenesulfonic acid or the like individually or in combination of two or more thereof, an anodic oxide film which is a hydrophilic film is formed on the surface of the aluminum plate. The conditions for the anodization treatment vary according to the electrolytic solution used and cannot be indiscriminately determined, but in general, suitable conditions are such that the electrolytic solution concentration is from 1 to 80 mass %, the liquid temperature is from 5 to 70° C., the current density is from 0.5 to 60 $A/dm^2$, the voltage is from 1 to 200 V and the electrolysis time is from 1 to 1,000 seconds. Among such anodization treatments, preferred are a method of performing the anodization treatment in a sulfuric acid electrolytic solution at a high current density described in British Patent 1,412,768 and a method of performing the anodization treatment by using a phosphoric acid as the electrolytic bath described in U.S. Pat. No. 3,511,661. Also, a multistage anodization treatment of performing the anodization treatment, for example, in a sulfuric acid and further in a phosphoric acid may be employed.

In the present invention, in view of press life and less scratchability, the coverage of the anodic oxide film is preferably 0.1 $g/m^2$ or more, more preferably 0.3 $g/m^2$ or more, still more preferably 2 $g/m^2$ or more, yet still more preferably 3.2 $g/m^2$ or more, and since a large energy is necessary for providing a thick film, preferably 100 $g/m^2$ or less, more preferably 40 $g/m^2$ or less, still more preferably 20 $g/m^2$ or less.

On the surface of the anodic oxide film, fine recesses called a micropore are formed and evenly distributed. The density of micropores present in the anodic oxide film can be adjusted by appropriately selecting the treatment conditions. By elevating the density of micropores, the thermal conductivity in the thickness direction of the anodic oxide film can be made to 0.05 to 0.5 W/mK. The micropore diameter can also be adjusted by appropriately selecting the treatment conditions. By enlarging the micropore diameter, the thermal conductivity in the thickness direction of the anodic oxide film can be made to be from 0.05 to 0.5 W/mK. The micropore diameter can also be adjusted by appropriately selecting the treatment conditions. By enlarging the micropore diameter, the thermal conductivity in the thickness direction of the anodic oxide film can be made to be from 0.05 to 0.5 W/mK.

In the present invention, for the purpose of decreasing the thermal conductivity, a pore wide treatment of enlarging the pore diameter of micropores is preferably performed after the anodization treatment. In this pore wide treatment, the aluminum substrate having formed thereon the anodic oxide film is dipped in an aqueous acid solution or an aqueous alkali solution, as a result, the anodic oxide film is dissolved and the pore diameter of micropores is enlarged. The pore wide treatment is preferably performed to dissolve the anodic oxide film in an amount of 0.01 to 20 g/m$^2$, more preferably from 0.1 to 5 g/m$^2$, still more preferably from 0.2 to 4 g/m$^2$.

In the case of using an aqueous acid solution for the pore wide treatment, an aqueous solution of an inorganic acid such as sulfuric acid, phosphoric acid, nitric acid or hydrochloric acid, or a mixture thereof is preferably used. The concentration of the aqueous acid solution is preferably from 10 to 1,000 g/L, more preferably from 20 to 500 g/L. The temperature of the aqueous acid solution is preferably from 10 to 90° C., more preferably from 30 to 70° C., and the dipping time in the aqueous acid solution is preferably from 1 to 300 seconds, more preferably from 2 to 100 seconds. On the other hand, in the case of using an aqueous alkali solution for the pore wide treatment, an aqueous solution of at least one alkali selected from the group consisting of sodium hydroxide, potassium hydroxide and lithium hydroxide is preferably used. The pH of the aqueous alkali solution is preferably from 10 to 13, more preferably from 11.5 to 13.0. The temperature of the aqueous alkali solution is preferably from 10 to 90° C., more preferably from 30 to 50° C., and the dipping time in the aqueous alkali solution is preferably from 1 to 500 seconds, more preferably from 2 to 100 seconds. However, if the mircopore diameter on the outermost surface is excessively enlarged, the antiscumming performance at printing deteriorates. The micropore diameter on the outermost surface is preferably made to be 40 nm or less, more preferably 20 nm or less, and most preferably 10 nm or less. Therefore, for ensuring both heat insulation and antiscumming performance, the anodic oxide film more preferably has a profile such that the surface micropore diameter is from 0 to 40 nm and the inner micropore diameter is from 20 to 300 nm. For example, when the electrolytic solution is the same kind, it is known that the pore diameter of pores produced by electrolysis is proportional to the electrolytic voltage at electrolysis. By utilizing this property, a method of gradually elevating the electrolytic voltage, thereby producing pores enlarged in the bottom, can be used. It is also known that when the kind of the electrolytic solution is changed, the pore diameter changes. The pore diameter is larger in the order of sulfuric acid, oxalic acid and phosphoric acid. Accordingly, a method of performing anodization by using a sulfuric acid for the electrolytic solution in the first stage and using a phosphoric acid in the second stage can be used. The lithographic printing plate support obtained through anodization treatment and/or pore wide treatment may also be subjected to a pore-sealing treatment described later.

Other than the above-described anodic oxide film, the hydrophilic film may be an inorganic film provided by sputtering, CVD or the like. Examples of the compound constituting the inorganic film include an oxide, a nitride, a silicide, a boride and a carbide. The inorganic film may comprise only a single compound or may comprise a mixture of compounds. Specific examples of the compound constituting the inorganic film include aluminum oxide, silicon oxide, titanium oxide, zirconium oxide, hafnium oxide, vanadium oxide, niobium oxide, tantalum oxide, molybdenum oxide, tungsten oxide, chromium oxide; aluminum nitride, silicon nitride, titanium nitride, zirconium nitride, hafnium nitride, vanadium nitride, niobium nitride, tantalum nitride, molybdenum nitride, tungsten nitride, chromium nitride, silicon nitride, boron nitride; titanium silicide, zirconium silicide, hafnium silicide, vanadium silicide, niobium suicide, tantalum silicide, molybdenum silicide, tungsten silicide, chromium silicide; titanium boride, zirconium boride, hafnium boride, vanadium boride, niobium boride, tantalum boride, molybdenum boride, tungsten boride, chromium boride; aluminum carbide, silicon carbide, titanium carbide, zirconium carbide, hafnium carbide, vanadium carbide, niobium carbide, tantalum carbide, molybdenum carbide, tungsten carbide and chromium carbide.

<Pore-Sealing Treatment>

In the present invention, as described above, the support for the lithographic printing plate of the present invention obtained by providing a hydrophilic layer may be subjected to a pore-sealing treatment. Examples of the pore-sealing treatment for use in the present invention include a pore-sealing treatment of an anodic oxide film by steam under pressure or hot water described in JP-A-4-176690 and JP-A-11-301135. Also, this treatment may be performed by using a known method such as silicate treatment, aqueous bichromate solution treatment, nitrite treatment, ammonium acetate salt treatment, electrodeposition pore-sealing treatment, triethanolamine treatment, barium carbonate treatment, or treatment with hot water containing a very slight amount of phosphate. For example, when electrodeposition pore-sealing treatment is applied, the pore-sealed film is formed from the bottom of a pore, and when steam pore-sealing treatment is applied, the pore-sealed film is formed from the top of a pore. Depending on the pore-sealing treatment, the manner of forming the pore-sealed film differs. Other examples of the treatment include dipping in a solution, spraying, coating, vapor deposition, sputtering, ion plating, flame spray coating and plating, but the treating method is not particularly limited. In particular, a pore-sealing treatment using particles having an average particle diameter of 8 to 800 nm described in JP-A-2002-214764 is preferred.

The pore-sealing treatment using particles is performed by using particles having an average particle diameter of 8 to 800 nm, preferably from 10 to 500 nm, more preferably from 10 to 150 nm. Within this range, the particles can be hardly fitted into the inside of a micropore present in the hydrophilic film and sufficiently high effect of elevating the sensitivity, good adhesion to the image recording layer and excellent press life are ensured. The thickness of the particle layer is preferably from 8 to 800 nm, more preferably from 10 to 500 nm.

The particle for use in the present invention preferably has a thermal conductivity of 60 W/mK or less, more preferably 40 W/mK or less, still more preferably from 0.3 to 10 W/mK. When the thermal conductivity is 60 W/mK or less, the diffusion of heat into the aluminum substrate can be satisfactorily prevented and a sufficiently high effect of elevating the sensitivity is obtained.

Examples of the method for providing the particle layer include, but are not limited to, dipping in a solution, spraying, coating, electrolysis, vapor deposition, sputtering, ion plating, flame spray coating and plating.

In the electrolysis, DC or AC can be used. Examples of the waveform of the AC for use in the electrolysis include sine wave, rectangular wave, triangular wave and trapezoidal wave. In view of the cost for producing a power source device, the frequency of the AC is preferably from 30 to 200 Hz, more preferably from 40 to 120 Hz. In the case of using a trapezoidal wave as the waveform of AC, the time tp for each current to reach the peak from 0 is preferably 0.1 to 2 msec, more preferably from 0.3 to 1.5 msec. If the tp is less than 0.1 msec, this may affect the impedance of the power source circuit to require a large power source voltage at the rising of current waveform and in turn, a high equipment cost for the power source.

As for the hydrophilic particle, $Al_2O_3$, $TiO_2$, $SiO_2$ and $ZrO_2$ are preferably used individually or in combination of two or more thereof. The electrolytic solution is obtained, for example, by suspending the hydrophilic particles in water or the like such that the hydrophilic particle content becomes from 0.01 to 20 mass % based on the entire. The electrolytic solution may be subjected to adjustment of pH, for example, by adding a sulfuric acid so as to have plus or minus electric charge. The electrolysis is preformed, for example, by passing DC while assigning the cathode to the aluminum plate and using the above-described electrolytic solution under the conditions such that the voltage is from 10 to 200 V and the treatment time is from 1 to 600 seconds. According to this method, the micropore present in the anodic oxide film can be easily closed while leaving a void in its inside.

Also, the pore-sealing treatment may be performed by a method of coating and thereby providing, for example, a layer comprising a compound having at least one amino group and at least one group selected from the group consisting of a carboxyl group or a salt thereof and a sulfo group or a salt thereof described in JP-A-60-19491; a layer comprising a compound selected from compounds having at least one amino group and at least one hydroxyl group, and salts thereof described in JP-A-60-232998; a layer containing a phosphate described in JP-A-62-19494; or a layer comprising a polymer compound containing at least one monomer unit having a sulfo group, as a repeating unit in the molecule described in JP-A-59-101651.

In addition, the pore-sealing treatment may be performed by a method of providing a layer comprising a compound selected from carboxymethyl cellulose; dextrin; gum arabic; phosphonic acids having an amino group, such as 2-aminoethylphosphonic acid; organic phosphonic acids such as phenylphosphonic acid, naphthylphosphonic acid, alkylphosphonic acid, glycerophosphonic acid, methylenediphosphonic acid and ethylenediphosphonic acid, which each may have a substituent; organic phosphoric acid esters such as phenylphosphoric acid, naphthylphosphoric acid, alkylphosphoric acid and glycerophosphoric acid, which each may have a substituent; organic phosphinic acids such as phenylphosphinic acid, naphthylphosphinic acid, alkylphosphinic acid and glycerophosphinic acid, which each may have a substituent; amino acids such as glycine and β-alanine; and hydrochlorides of amines having a hydroxyl group, such as hydrochloride of triethanolamine.

In the pore-sealing treatment, a silane coupling agent having an unsaturated group may be applied. Examples of the silane coupling agent include N-3-(acryloxy-2-hydroxypropyl)-3-aminopropyltriethoxysilane, (3-acryloxypropyl) dimethylmethoxysilane, (3-acryloxypropyl)methyldimethoxysilane, (3-acryloxypropyl)trimethoxysilane, 3-(N-allylamino)propyltrimethoxysilane, allyldimethoxysilane, allyltriethoxysilane, allyltrimethoxysilane, 3-butenyltriethoxysilane, 2-(chloromethyl)allyltrimethoxysilane, methacrylamidopropyltriethoxysilane, N-(3-methacryloxy-2-hydroxypropyl)-3-aminopropyltriethoxysilane, (methacryloxymethyl)dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylmethyltriethoxysilane, methacryloxypropylmethyltrimethoxysilane, methacryloxypropyltris (methoxyethoxy)silane, methoxydimethylvinylsilane, 1-methoxy-3-(trimethylsiloxy)butadiene, styrylethyltrimethoxysilane, 3-(N-styrylmethyl-2-aminoethylamino)propyltrimethoxysilane hydrochloride, vinyldimethylethoxysilane, vinyldiphenylethoxysilane, vinylmethyldiethoxysilane, vinylmethyldimethoxysilane, o-(vinyloxyethyl)-N-(triethoxysilylpropyl)urethane, vinyltriethoxysilane, vinyltrimethoxysilane, vinyltri-tert-butoxysilane, vinyltriisopropoxysilane, vinyltriphenoxysilane, vinyltris(2-methoxyethoxy)silane and diallylaminopropylmethoxysilane. Among these, preferred are silane coupling agents having a methacryloyl group or an acryloyl group, which are high in the reactivity of unsaturated group.

Other examples of the treatment include a sol-gel coating treatment described in JP-A-5-50779, a treatment of coating phosphonic acids described in JP-A-5-246171, a treatment of coating a backcoat material described in JP-A-6-234284, JP-A-6-191173 and JP-A-6-230563, a treatment with phosphonic acids described in JP-A-6-262872, a coating treatment described in JP-A-6-297875, an anodization treatment described in JP-A-10-109480, and a dipping treatment described in JP-A-2000-81704 and JP-A-2000-89466, and any of these methods may be used.

After forming the hydrophilic film, the aluminum plate surface is subjected to a hydrophilization treatment, if desired.

The hydrophilization treatment includes an alkali metal silicate method described in U.S. Pat. Nos. 2,714,066, 3,181,461, 3,280,734 and 3,902,734. In this method, the support is dipped in an aqueous solution of sodium silicate or the like or is electrolyzed. Other examples include a method of treating the support with potassium fluorozirconate described in JP-B-36-22063, and a method of treating the support with polyvinylphosphonic acid described in U.S. Pat. Nos. 3,276,868, 4,153,461 and 4,689,272.

The support preferably has a center line average roughness of 0.10 to 1.2 μm. Within this range, good adhesion to the image recording layer, good press life and good antiscumming property can be obtained.

The color density of the support is preferably from 0.15 to 0.65 in terms of the reflection density value. Within this range, good image-forming property by virtue of antihalation at the image exposure and good suitability for plate inspection after development can be obtained.

[Backcoat Layer]

After the support is subjected to a surface treatment or formation of an undercoat layer, a backcoat may be provided on the back surface of the support, if desired.

Suitable examples of the backcoat include a coat layer comprising a metal oxide obtained by hydrolyzing and polycondensing an organic polymer compound described in JP-A-5-45885 or an organic or inorganic metal compound described in JP-A-6-35174. Among these, those using an alkoxy compound of silicon, such as $Si(OCH_3)_4$, $Si(OC_2H_5)_4$, $Si(OC_3H_7)_4$ and $Si(OC_4H_9)_4$, are preferred because the raw material is inexpensive and easily available.

[Undercoat Layer]

In the lithographic printing plate precursor of the present invention, if desired, an undercoat layer can be provided between the image recording layer and the support. The undercoat layer functions as a heat-insulating layer, as a result, the heat generated upon exposure with infrared laser is prevented from diffusing into the support and can be efficiently used and therefore, the sensitivity can be advantageously elevated. Furthermore, in the unexposed area, the image recording layer is rendered easily separable from the support and therefore, the on-press developability is enhanced.

Specific suitable examples of the undercoat layer include a silane coupling agent having an addition-polymerizable ethylenic double bond reactive group described in JP-A-10-282679 and a phosphorus compound having an ethylenic double bond reactive group described in JP-A-2-304441.

The amount coated (solid content) of the undercoat layer is preferably from 0.1 to 100 mg/$m^2$, more preferably from 1 to 30 mg/$m^2$.

[Protective Layer]

In the lithographic printing plate precursor of the present invention, a protective layer may be provided on the image recording layer, if desired, for the purpose of preventing generation of scratches or the like on the image recording layer, blocking oxygen or preventing ablation at the exposure with a high-intensity laser.

In the present invention, the exposure is usually performed in air and the protective layer prevents low molecular compounds such as oxygen and basic substance present in air, which inhibit an image-forming reaction occurring upon exposure in the image recording layer, from mixing into the image recording layer and thereby prevents the inhibition of image-forming reaction at the exposure in air. Accordingly, the property required of the protective layer is low permeability to low molecular compounds such as oxygen. Furthermore, the protective layer preferably has good transparency to light used for exposure, excellent adhesion to the image recording layer, and easy removability during on-press development after exposure. Various studies have been heretofore made on the protective layer having these properties, and such protective layers are described in detail, for example, in U.S. Pat. No. 3,458,311 and JP-A-55-49729.

Examples of the material used for the protective layer include water-soluble polymer compounds having relatively excellent crystallinity. Specific examples thereof include water-soluble polymers such as polyvinyl alcohol, polyvinylpyrrolidone, acidic celluloses, gelatin, gum arabic and polyacrylic acid.

In particular, when polyvinyl alcohol (PVA) is used as the main component, most excellent results are obtained with respect to basic properties such as oxygen-blocking property and development removability. As long as the polyvinyl alcohol contains an unsubstituted vinyl alcohol unit for giving necessary oxygen-blocking property and water solubility to the protective layer, a part thereof may be replaced by an ester, an ether or an acetal or may have another copolymerization component.

Examples of the polyvinyl alcohol which can be suitably used include those having a hydrolysis degree of 71 to 100% and a polymerization degree of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components (for example, selection of PVA and use of additives), coated amount and the like of the protective layer are appropriately selected by taking account of fogging, adhesion, scratch resistance and the like in addition to the oxygen-blocking property and development removability. In general, as the PVA has a higher percentage of hydrolysis (namely, as the unsubstituted vinyl alcohol unit content in the protective layer is higher) or as the layer thickness is larger, the oxygen-blocking property is enhanced and this is preferred in view of sensitivity. Also, in order to prevent the generation of unnecessary polymerization reaction at the production or during storage or unnecessary fogging at the image exposure or prevent thickening or the like of the image line, an excessively high oxygen permeability is not preferred. Accordingly, the oxygen permeability A at 25° C. and 1 atm is preferably $0.2 \leqq A \leqq 20$ (ml/$m^2$·day).

As other components of the protective layer, glycerin, dipropylene glycol or the like may be added in an amount corresponding to several mass % based on the water-soluble polymer compound so as to impart flexibility. Also, an anionic surfactant such as sodium alkylsulfate and sodium alkylsulfonate; an amphoteric surfactant such as alkylaminocarboxylate and alkylaminodicarboxylate; or a nonionic surfactant such as polyoxyethylene alkylphenyl ether may be added in an amount of several mass % based on the (co)polymer.

The thickness of the protective layer is preferably from 0.1 to 5 μm, more preferably from 0.2 to 2 μm.

The adhesion to the image area, scratch resistance and the like of the protective layer are also very important in view of handling of the lithographic printing plate precursor. More specifically, when a protective layer which is hydrophilic by containing a water-soluble polymer compound is stacked on the image recording layer which is lipophilic, the protective layer is readily separated due to insufficient adhesive strength and in the separated portion, defects such as curing failure ascribable to polymerization inhibition by oxygen may be caused.

In order to solve this problem, various proposals have been made with an attempt to improve the adhesive property between the image recording layer and the protective layer. For example, JP-A-49-70702 and Unexamined British Patent Publication No. 1,303,578 describe a technique of mixing from 20 to 60 mass % of an acrylic emulsion, a water-insoluble vinylpyrrolidone-vinyl acetate copolymer or the like in a hydrophilic polymer mainly comprising polyvinyl alcohol, and stacking the obtained solution on the image recording layer, thereby obtaining sufficiently high adhesive property. In the present invention, these known techniques all can be used. The method for coating the protective layer is described in detail, for example, in U.S. Pat. No. 3,458,311 and JP-A-55-49729.

In the present invention, a part of the image forming components (e.g., radical initiator, infrared absorbent) may be incorporated into the protective layer. This embodiment of incorporating such image forming components into the protective layer but not into the image recording layer is preferred, because the image forming components are separated from discoloration in the image recording layer and respective reactions can be prevented from inhibiting each other. It is also a preferred embodiment to enclose such image forming components in a microcapsule and incorporate the microcapsule into the protective layer. Such image forming components may also be incorporated into both the protective layer and the image recording layer.

Furthermore, other functions may be imparted to the protective layer. For example, when a colorant (for example, water-soluble dye) excellent in the transparency to infrared ray used for exposure and capable of efficiently absorbing light at other wavelengths is added, the aptitude for safelight can be enhanced without causing reduction in the sensitivity.

[Exposure]

In the lithographic printing method of the present invention, the above-described lithographic printing plate precursor of the present invention is imagewise exposed by an infrared laser.

The infrared laser for use in the present invention is not particularly limited, but suitable examples thereof include a solid or semiconductor laser of emitting an infrared ray at a wavelength of 760 to 1,200 nm. The output of the infrared laser is preferably 100 mW or more and in order to shorten the exposure time, a multi-beam laser device is preferably used.

The exposure time is preferably 20μ seconds or less per one picture element. The amount of energy irradiated is preferably from 10 to 300 mJ/cm$^2$.

[Printing Method]

In the lithographic printing method of the present invention, after the lithographic printing plate precursor of the present invention is imagewise exposed with an infrared laser as described above, printing is performed by supplying an oily ink and an aqueous component without passing through any development processing step.

Specific examples of the method therefor include a method of exposing the lithographic printing plate precursor with an infrared laser, then loading it on a printing press without passing through a development processing step and performing printing, and a method of loading the lithographic printing plate precursor on a printing press, exposing it with an infrared laser on the printing press, and performing printing without passing through a development processing step.

For example, in one embodiment of the negative on-press development-type lithographic printing plate precursor, when the lithographic printing plate precursor is imagewise exposed with an infrared laser and then printing is performed by supplying an aqueous component and an oily ink without passing through a development processing step such as wet development, the image recording layer cured by the exposure forms an oily ink-receiving part having a lipophilic surface in the exposed area of the image recording layer. On the other hand, in the unexposed area, the uncured image recording layer is removed by dissolving or dispersing in the supplied aqueous component and/or oily ink and the hydrophilic surface is revealed in this portion.

As a result, the aqueous component adheres to the revealed hydrophilic surface and the oily ink adheres to the image recording layer in the exposed region, thereby starting the printing. Here, either the aqueous component or the oily ink may be first supplied to the plate surface, but the oily ink is preferably first supplied so as to prevent the aqueous component from being contaminated by the image recording layer in the unexposed area. A fountain solution and a printing ink for normal lithographic printing are used as the aqueous component and the oily ink, respectively.

In this way, the lithographic printing plate precursor is on-press developed on an off-set printing press and used as-is for printing a large number of sheets.

EXAMPLES

The present invention is described in greater detail below by referring to the Examples, but the present invention should not be construed as being limited thereto.

Examples 1 to 5 and Comparative Examples 1 to 3

(Preparation of Support)

A 0.3 mm-thick aluminum plate according to JIS-A-1050 was treated by practicing the following steps (a) to (k) in this order.

(a) Mechanical Surface-Roughening Treatment

A mechanical surface-roughening treatment was performed by using a rotating roller-shaped nylon brush while supplying, as an abrasive slurry, a suspension of an abrasive (quartz sand) having a specific gravity of 1.12 in water to the aluminum plate surface. The average particle diameter of the abrasive was 8 μm and the maximum particle diameter was 50 μm. The nylon brush used was made of 6·10-nylon and had a bristle length of 50 mm and a bristle diameter of 0.3 mm. This nylon brush was produced by perforating holes in a stainless steel-made cylinder having a diameter of 300 mm and densely implanting bristles in the holes. Three rotary brushes were used. The distance between two support rollers (ϕ200 mm) disposed below the brush was 300 mm. The brush roller was pressed to the aluminum plate until the load of the driving motor for rotating the brush became 7 kW larger than the load before the brush roller was pressed to the aluminum plate. The rotating direction of the brush was the same as the traveling direction of the aluminum plate. The rotation number of the brush was 200 rpm.

(b) Alkali Etching

An etching treatment was performed by spraying an aqueous NaOH solution (concentration: 26 mass %, aluminum ion concentration: 6.5 mass %) at a temperature of 70° C. on the obtained aluminum plate to dissolve 6 g/m$^2$ of the aluminum plate. Thereafter, the aluminum plate was washed by spraying well water.

(c) Desmutting Treatment

A desmutting treatment was performed by spraying an aqueous solution having a nitric acid concentration of 1 mass % (containing 0.5 mass % of aluminum ion) at a temperature of 30° C., and then the aluminum plate was water-washed by spraying. For the aqueous nitric acid solution used for the desmutting, the waste solution in the step of performing electrochemical surface-roughening by using AC in an aqueous nitric acid solution was used.

(d) Electrochemical Surface-Roughening Treatment

An electrochemical surface-roughening treatment was continuously performed by using AC voltage of 60 Hz. At this time, the electrolytic solution was an aqueous solution containing 10.5 g/liter of nitric acid (containing 5 g/liter of aluminum ion) at a temperature of 50° C. The electrochemical surface-roughening treatment was performed by using an AC power source of passing rectangular wave AC with a trapezoidal waveform such that the time TP necessary for the current value to reach the peak from 0 was 0.8 msec and the duty ratio was 1:1, and disposing a carbon electrode as the counter electrode. The auxiliary anode was ferrite. The electrolytic cell used was a radial cell type. The current density was 30 $A/dm^2$ in terms of the peak value of current, the total quantity of electricity at the time of the aluminum plate serving as the anode was 220 $C/dm^2$, and 5% of the current flowing from the power source was split to the auxiliary anode. Thereafter, the aluminum plate was washed by spraying well water.

(e) Alkali Etching Treatment

The aluminum plate was etched at 32° C. by spraying an etching solution having a sodium hydroxide concentration of 26 mass % and an aluminum ion concentration of 6.5 mass % to dissolve 0.20 $g/m^2$ of the aluminum plate, whereby the smut component mainly comprising aluminum hydroxide produced at the electrochemical surface-roughening performed by using AC in the previous stage was removed, and the edge portion of the produced pit was dissolved to smoothen the edge portion. Thereafter, the aluminum plate was washed by spraying well water. The etched amount was 3.5 $g/m^2$.

(f) Desmutting Treatment

A desmutting treatment was performed by spraying an aqueous solution having a nitric acid concentration of 15 mass % (containing 4.5 mass % of aluminum ion) at a temperature of 30° C., and then the aluminum plate was washed by spraying well water.

For the aqueous nitric acid solution used for the desmutting, the waste solution in the step of performing electrochemical surface-roughening by using AC in an aqueous nitric acid solution was used.

(g) Electrochemical Surface-Roughening Treatment

An electrochemical surface-roughening treatment was continuously performed by using AC voltage of 60 Hz. At this time, the electrolytic solution was an aqueous solution containing 7.5 g/liter of hydrochloric acid (containing 5 g/liter of aluminum ion) at a temperature of 35° C. The electrochemical surface-roughening treatment was performed by using an AC power source with a rectangular waveform and disposing a carbon electrode as the counter electrode. The auxiliary anode was ferrite. The electrolytic cell used was a radial cell type. The current density was 25 $A/dm^2$ in terms of the peak value of current, and the total quantity of electricity at the time of the aluminum plate serving as the anode was 50 $C/dm^2$. Thereafter, the aluminum plate was washed by spraying well water.

(h) Alkali Etching Treatment

The aluminum plate was etched at 32° C. by spraying an etching solution having a sodium hydroxide concentration of 26 mass % and an aluminum ion concentration of 6.5 mass % to dissolve 0.10 $g/m^2$ of the aluminum plate, whereby the smut component mainly comprising aluminum hydroxide produced at the electrochemical surface-roughening performed by using AC in the previous stage was removed, and the edge portion of the produced pit was dissolved to smoothen the edge portion. Thereafter, the aluminum plate was washed by spraying well water.

(i) Desmutting Treatment

A desmutting treatment was performed by spraying an aqueous solution having a sulfuric acid concentration of 25 mass % (containing 0.5 mass % of aluminum ion) at a temperature of 60° C., and then the aluminum plate was washed by spraying well water.

(j) Anodization Treatment

For the electrolytic solution, sulfuric acid was used. The electrolytic solution had a sulfuric acid concentration of 170 g/liter (containing 0.5 mass % of aluminum ion), and the temperature thereof was 43° C. Thereafter, the aluminum plate was washed by spraying well water. The current density was about 30 $A/dm^2$. The final oxide film coverage was 2.7 $g/m^2$.

(k) Alkali Metal Silicate Treatment

An alkali metal silicate treatment (silicate treatment) was performed by dipping the resulting aluminum plate in a treating tank containing an aqueous 1 mass % No. 3 sodium silicate solution at a temperature of 30° C. for 10 seconds. Thereafter, the aluminum plate was washed by spraying well water to produce an aluminum support. At this time, the silicate add-in amount was 3.6 $mg/m^2$.

(Formation of Image Recording Layer)

On the obtained support, Coating Solution (1) for Image Recording Layer having the following composition was coated by a wire bar and dried at 80° C. for 60 seconds to form an image recording layer. The coated amount was 1.0 $g/m^2$.

Composition of Coating Solution (1) for Image Recording Layer:

| | |
|---|---|
| Infrared Absorbing Dye (D-1) shown below | 3 parts by mass |
| Radical Initiator (I-1) | 10 parts by mass |
| Isocyanuric acid EO-modified triacrylate (NK Ester M-315, produced by Shin-Nakamura Chemical Co., Ltd.) | 55 parts by mass |
| Binder Polymer (B-1) shown below | 20 parts by mass |
| Cyclic color-forming compound (compound shown in Table 1) | 5 parts by mass |
| Dye stabilizer (compound shown in Table 1) | 15 parts by mass |
| Fluorine-Containing Surfactant (W-1) shown below | 6 parts by mass |
| Methyl ethyl ketone | 900 parts by mass |

Infrared Absorbent (D-1):

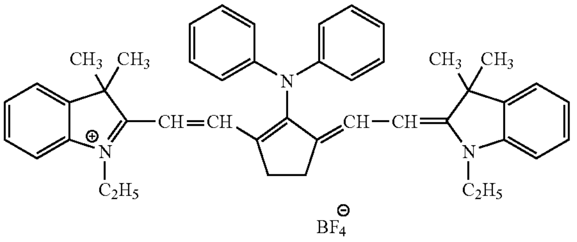

Initiator (I-1) (solubility in water: 40 or more):

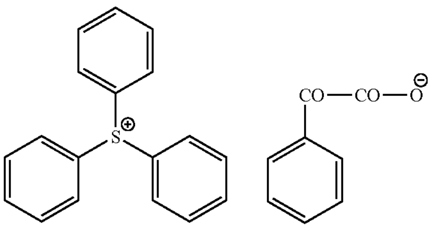

[B-1]:

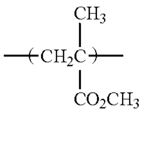

$\overline{Mw}$ : 50, 000

-continued

Fluorine-Containing Surfactant (W-1):

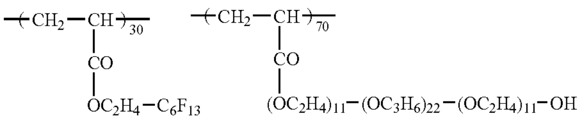

Thereafter, Coating Solution (1) for Water-Soluble Protective Layer having the following composition was coated by a wire bar on the image recording layer to have a dry coated amount of 0.5 g/$m^2$ and dried at 125° C. for 75 seconds to produce a lithographic printing plate precursor.

Composition of Coating Solution (1) for Water-Soluble Protective Layer:

| | |
|---|---|
| Polyvinyl alcohol (saponification degree: 98 mol %, polymerization degree: 500) | 95 parts by mass |
| Polyvinylpyrrolidone/vinyl acetate copolymer (Luvitec VA 64W, produced by BASF) | 4 parts by mass |
| Nonionic surfactant (EMALEX710, produced by Nihon Emulsion Co., Ltd.) | 1 part by mass |
| Water | 3,000 parts by mass |

(Evaluation of Lithographic Printing Plate Precursor)

On the obtained lithographic printing plate precursor, a test pattern was image-exposed by an image setter (Trendsetter 3244VX, manufactured by Creo) at a beam intensity of 10.2 W and a drum rotation speed of 150 rpm. The contrast between unexposed region and exposed region, that is, clear viewing of image (visibility), was evaluated. This plate was loaded on a cylinder of a printing press (SPRINT S26, manufactured by Komori Corp.) without passing through development processing and thereafter, printing was performed by supplying, as the fountain solution, a 4 mass % diluted solution of a commercially available fountain stock solution (IF-102, produced by Fuji Photo Film Co., Ltd.), then supplying black ink (Values-G (black) produced by Dai-Nippon Ink & Chemicals, Inc.) and further supplying paper.

<Evaluation of Image Visibility>

The L* values of exposed area and unexposed area were measured by a color-difference meter (Color and Color-Difference Meter CR-221, manufactured by Minolta Co., Ltd.) and from the absolute value of the difference therebetween, the lightness difference ΔL was determined. A larger numerical value is better. Also, evaluation with an eye was performed. Rating ○ is tolerable, and rating × is intolerable.

<Evaluation of Sensitivity-Press Life>

The number of sheets when printing could be performed was evaluated and shown by an index assuming that Example 1 was 100. A larger number is better.

<Evaluation of On-Press Developability>

The number of sheets required for obtaining a printed matter was evaluated and shown by an index assuming that Example 1 was 100. A smaller number is better.

<Evaluation of Storage Stability>

The unexposed lithographic printing plate precursor was stored at 45° C. and a humidity of 75% for 3 days, and the change in color between before and after storage was evaluated with an eye.

Rating o indicates that difference is not observed or thinly observed but tolerable, and rating x indicates that difference is observed.

<Evaluation of White Light Safety>

The unexposed lithographic printing plate precursor was left standing under a fluorescent lamp (1,000 lux) for 2 hours and the change in color between before and after standing was evaluated with an eye.

Rating ○ indicates that difference is not observed or thinly observed but tolerable, and rating × indicates that difference is observed.

TABLE 1

| | Cyclic Color-Forming Compound | Dye Stabilizer | Image Visibility (ΔL) | Sensitivity-Press Life | On-Press Developability | Storage Stability | White Light Stability |
|---|---|---|---|---|---|---|---|
| Example 1 | X-1 | Y-1 | ○ (5.0) | 100 | 100 | ○ | ○ |
| Example 2 | X-2 | Y-2 | ○ (4.0) | 100 | 80 | ○ | ○ |
| Example 3 | X-3 | Y-3 | ○ (6.0) | 120 | 100 | ○ | ○ |
| Example 4 | X-4 | Y-3 | ○ (4.0) | 130 | 80 | ○ | ○ |
| Example 5 | X-5 | Y-2 | ○ (5.0) | 110 | 100 | ○ | ○ |
| Comparative Example 1 | none | Y-1 | x (0.6) | 100 | 100 | ○ | ○ |
| Comparative Example 2 | X-1 | none | x (1.0) | 80 | 200 | x | ○ |
| Comparative Example 3 | X-4 | none | x (1.2) | 70 | 300 | ○ | x |

As apparent from Table 1, the negative lithographic printing plate precursor having the color image recording layer of the present invention is satisfied in all of high-sensitivity-high press life, good image visibility, good on-press developability, good storage stability and good white light stability.

This application is based on Japanese patent application JP 2004-246908, filed on Aug. 26, 2004, the entire content of which is hereby incorporated by reference, the same as if set forth at length.

What is claimed is:

1. A color image-forming material comprising an image recording layer capable of drawing an image by infrared laser exposure, the color image-forming material forming a color image without passing through a development processing step after image recording, wherein said image recording layer comprises (A) an infrared absorbent, (B) a cyclic color-forming compound having a cyclic structure within the molecule and forming a dye by a ring opening, and (C) a dye stabilizer which is a compound interacting with said cyclic color-forming compound to stabilize the ring-opened dye body and cause color formation and which is released from the interaction upon laser exposure, wherein the dye stabilizer comprises:

an ionic compound; or a compound with one or more acid groups selected from the following:

i) low molecular weight compounds which have a phenolic OH group;

ii) low molecular weight or polymer compounds which have a carboxylic acid group;

iii) low molecular weight or polymer compounds which have a phosphoric acid group or a phosphonic acid group; or (iv) low molecular weight or polymer compounds which have a sulfonic acid group.

2. A lithographic printing plate precursor comprising a support and an image recording layer capable of drawing an image by infrared laser exposure, the lithographic printing plate precursor being capable of printing by loading it on a printing press without passing through a development process step after image recording or by recording an image after loading it on a printing press, wherein said image recording layer comprises (A) an infrared absorbent, (B) a cyclic color-forming compound having a cyclic structure within the molecule and forming a dye by a ring opening, and (C) a dye stabilizer which is a compound interacting with said cyclic color-forming compound to stabilize the ring-opened dye body and cause color formation and which is released from the interaction upon laser exposure wherein the dye stabilizer comprises:

an ionic compound; or a compound with one or more acid groups selected from the following:

i) low molecular weight compounds which have a phenolic OH group;

ii) low molecular weight or polymer compounds which have a carboxylic acid group;

iii) low molecular weight or polymer compounds which have a phosphoric acid group or a phosphonic acid group; or (iv) low molecular weight or polymer compounds which have a sulfonic acid group.

3. The lithographic printing plate precursor as claimed in claim 2, wherein the image recording layer comprises a radical polymerization initiator and a polymerizable compound.

4. The lithographic printing plate precursor as claimed in claim 2, wherein the image recording layer is an image recording layer removable by a printing ink and/or a fountain solution.

5. The color image-forming material as claimed in claim 1, wherein the cyclic color-forming compound (B) is selected from the group consisting of the compounds represented by the following formulae (I) to (IV):

(I)

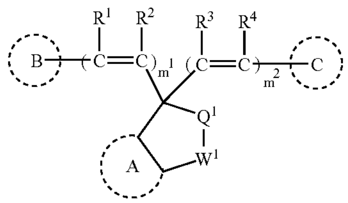

wherein the rings A, B and C each independently represents a mono-, di- or tri-nuclear aromatic hydrocarbon group which may have a substituent, or a mono-, di- or tri-nuclear aromatic heterocyclic group which may have a substituent, $W^1$ represents a carbonyl group, a thiocarbonyl group or a group —$C(R^{25})$=N—, $R^{25}$ represents a hydrogen atom or a hydrocarbon group which may have a substituent, $Q^1$ represents an oxygen atom, a sulfur atom or an imino group which may have a substituent, $R^1$ to $R^4$ each independently represents a hydrogen atom or a hydrocarbon group which may have a substituent, $m^1$ represents 0 or 1, $m^2$ represents 0 or 1, and the rings B and C may combine with each other through a binding group, with the proviso that at least one of the ring B and the ring C has at least one substituent selected from the group consisting of an amino group which may have a substituent, an alkoxy group which may have a substituent, an aryloxy group which may have a substituent, an alkylthio group which may have a substituent, and an arylthio group which may have a substituent;

(II)

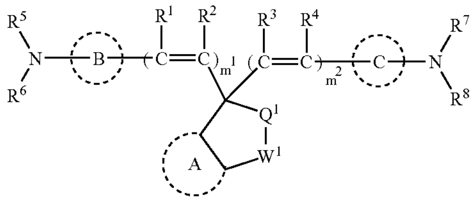

wherein the rings A, B and C each independently represents a mono-, di- or tri-nuclear aromatic hydrocarbon group which may have a substituent, or a mono-, di- or tri-nuclear aromatic heterocyclic group which may have a substituent, $W^1$ represents a carbonyl group, a thiocarbonyl group or a group —$C(R^{25})$=N—, $R^{25}$ represents a hydrogen atom or a hydrocarbon group which may have a substituent, $Q^1$ represents an oxygen atom, a sulfur atom or an imino group which may have a substituent, $R^1$ to $R^4$ each independently represents a hydrogen atom or a hydrocarbon group which may have a substituent, $m^1$ represents 0 or 1, $m^2$ represents 0 or 1, $R^5$ to $R^8$ each independently represents a hydrogen atom, a hydrocarbon group which may have a substituent, or an acyl group which may have a substituent, the rings B and C may combine with each other through a binding group, $R^5$ or $R^6$ and the ring B may combine with each other through a binding group, and $R^7$ or $R^8$ and the ring C may combine with each other through a binding group;

(III)

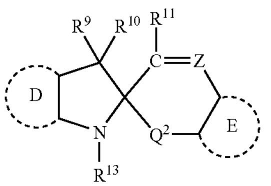

wherein the rings D and E each independently represents a mono-, di- or tri-nuclear aromatic hydrocarbon group which may have a substituent, or a mono-, di- or tri-nuclear aromatic heterocyclic group which may have a substituent, $Q^2$ represents an oxygen atom or a sulfur atom, $R^9$ to $R^{11}$ each independently represents a hydrogen atom, a halogen atom or a hydrocarbon group which may have a substituent, $R^{13}$ represents a hydrogen atom or a hydrocarbon group which may have a substituent, Z represents C—$R^{12}$ or N, and $R^{12}$ represents a hydrogen atom, a halogen atom or a hydrocarbon group which may have a substituent; and (IV)

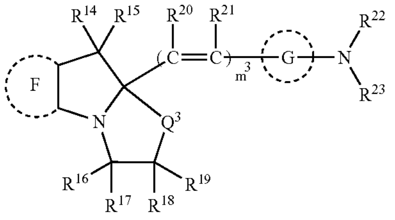

wherein the rings F and G each independently represents a mono-, di- or tri-nuclear aromatic hydrocarbon group which may have a substituent, or a mono-, di- or tri-nuclear aromatic heterocyclic group which may have a substituent, $R^{14}$ to $R^{21}$ each independently represents a hydrogen atom or a hydrocarbon group which may have a substituent, $R^{22}$ and $R^{23}$ each independently represents a hydrogen atom, a hydrocarbon group which may have a substituent, or an acyl group which may have a substituent, $Q^3$ represents an oxygen atom or a sulfur atom, and $m^3$ represents 1 or 2.

6. The lithographic printing plate precursor as claimed in claim 2, wherein the cyclic color-forming compound (B) is selected from the group consisting of the compounds represented by the following formulae (I) to (IV):

(I)

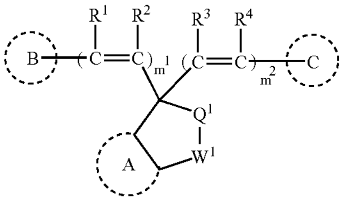

wherein the rings A, B and C each independently represents a mono-, di- or tri-nuclear aromatic hydrocarbon group which may have a substituent, or a mono-, di- or tri-nuclear aromatic heterocyclic group which may have a substituent, $W^1$ represents a carbonyl group, a thiocarbonyl group or a group —C($R^{25}$)═N—, $R^{25}$ represents a hydrogen atom or a hydrocarbon group which may have a substituent, $Q^1$ represents an oxygen atom, a sulfur atom or an imino group which may have a substituent, $R^1$ to $R^4$ each independently represents a hydrogen atom or a hydrocarbon group which may have a substituent, $m^1$ represents 0 or 1, $m^2$ represents 0 or 1, and the rings B and C may combine with each other through a binding group, with the proviso that at least one of the ring B and the ring C has at least one substituent selected from the group consisting of an amino group which may have a substituent, an alkoxy group which may have a substituent, an aryloxy group which may have a substituent, an alkylthio group which may have a substituent, and an arylthio group which may have a substituent;

(II)

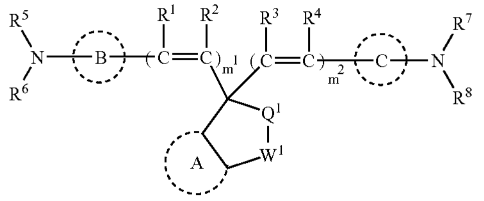

wherein the rings A, B and C each independently represents a mono-, di- or tri-nuclear aromatic hydrocarbon group which may have a substituent, or a mono-, di- or tri-nuclear aromatic heterocyclic group which may have a substituent, $W^1$ represents a carbonyl group, a thiocarbonyl group or a group —C($R^{25}$)═N—, $R^{25}$ represents a hydrogen atom or a hydrocarbon group which may have a substituent, $Q^1$ represents an oxygen atom, a sulfur atom or an imino group which may have a substituent, $R^1$ to $R^4$ each independently represents a hydrogen atom or a hydrocarbon group which may have a substituent, $m^1$ represents 0 or 1, $m^2$ represents 0 or 1, $R^5$ to $R^8$ each independently represents a hydrogen atom, a hydrocarbon group which may have a substituent, or an acyl group which may have a substituent, the rings B and C may combine with each other through a binding group, $R^5$ or $R^6$ and the ring B may combine with each other through a binding group, and $R^7$ or $R^8$ and the ring C may combine with each other through a binding group;

(III)

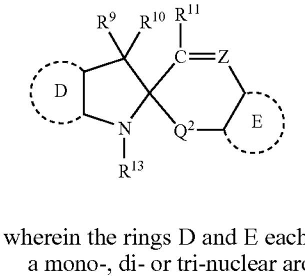

wherein the rings D and E each independently represents a mono-, di- or tri-nuclear aromatic hydrocarbon group which may have a substituent, or a mono-, di- or tri-nuclear aromatic heterocyclic group which may have a substituent, $Q^2$ represents an oxygen atom or a sulfur atom, $R^9$ to $R^{11}$ each independently represents a hydrogen atom, a halogen atom or a hydrocarbon group which may have a substituent, $R^{13}$ represents a hydrogen atom or a hydrocarbon group which may have a substituent, Z represents C—$R^{12}$ or N, and $R^{12}$ represents a hydrogen atom, a halogen atom or a hydrocarbon group which may have a substituent; and (IV)

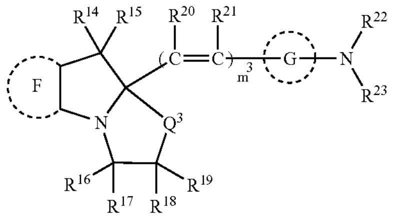

wherein the rings F and G each independently represents a mono-, di- or tri-nuclear aromatic hydrocarbon group which may have a substituent, or a mono-, di- or tri-nuclear aromatic heterocyclic group which may have a substituent, $R^{14}$ to $R^{21}$ each independently represents a hydrogen atom or a hydrocarbon group which may have a substituent, $R^{22}$ and $R^{23}$ each independently represents a hydrogen atom, a hydrocarbon group which may have a substituent, or an acyl group which may have a substituent, $Q^3$ represents an oxygen atom or a sulfur atom, and $m^3$ represents 1 or 2.

7. A lithographic printing method comprising: image-exposing the lithographic printing plate precursor claimed in claim 2 by using an infrared laser; performing a plate-making by removing the unexposed area of the image recording layer of the image-exposed lithographic printing plate precursor on a printing press; and performing printing by using the produced lithographic printing plate.

* * * * *